US011637110B2

(12) United States Patent
Kim et al.

(10) Patent No.: US 11,637,110 B2
(45) Date of Patent: *Apr. 25, 2023

(54) SEMICONDUCTOR DEVICE

(71) Applicant: Samsung Electronics Co., Ltd., Suwon-si (KR)

(72) Inventors: Jihye Kim, Anyang-si (KR); Jaehoon Lee, Cheongju-si (KR); Jiyoung Kim, Hwaseong-si (KR); Bongtae Park, Seoul (KR); Jaejoo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/580,811

(22) Filed: Jan. 21, 2022

(65) Prior Publication Data
US 2022/0149056 A1 May 12, 2022

Related U.S. Application Data

(63) Continuation of application No. 16/827,778, filed on Mar. 24, 2020, now Pat. No. 11,233,062.

(30) Foreign Application Priority Data

Aug. 2, 2019 (KR) .......................... 10-2019-0094345

(51) Int. Cl.
*H01L 27/108* (2006.01)
*H01L 21/8242* (2006.01)
(Continued)

(52) U.S. Cl.
CPC .. *H01L 27/11206* (2013.01); *H01L 27/10876* (2013.01); *H01L 27/11585* (2013.01); *H01L 27/3223* (2013.01); *H01L 29/4925* (2013.01)

(58) Field of Classification Search
CPC ....................... H01L 27/3223; H01L 27/11582
(Continued)

(56) References Cited

U.S. PATENT DOCUMENTS 9,425,238 B2 * 8/2016 Yi ........................... H01L 45/16
9,870,991 B1 1/2018 Kim et al.
(Continued)

FOREIGN PATENT DOCUMENTS

JP 6495838 B2 4/2019
KR 20180026211 A 3/2018
(Continued)

OTHER PUBLICATIONS

Office Action, dated Nov. 4, 2021, issued by the German Patent and Trademark Office for corresponding application DE 102020108091.3, and translation thereof (18 pages).

*Primary Examiner* — Calvin Lee
(74) *Attorney, Agent, or Firm* — Muir Patent Law, PLLC

(57) ABSTRACT

A semiconductor device includes a substrate having a conductive region and an insulating region; gate electrodes including sub-gate electrodes spaced apart from each other and stacked in a first direction perpendicular to an upper surface of the substrate and extending in a second direction perpendicular to the first direction and gate connectors connecting the sub-gate electrodes disposed on the same level; channel structures penetrating through the gate electrodes and extending in the conductive region of the substrate; and a first dummy channel structure penetrating through the gate electrodes and extending in the insulating region of the substrate and disposed adjacent to at least one side of the gate connectors in a third direction perpendicular to the first and second directions.

19 Claims, 29 Drawing Sheets

(51) Int. Cl.
  *H01L 27/112*    (2006.01)
  *H01L 27/11585*  (2017.01)
  *H01L 27/32*     (2006.01)
  *H01L 29/49*     (2006.01)

(58) Field of Classification Search
  USPC .......................... 438/242, 270; 257/302, 314
  See application file for complete search history.

(56) References Cited

U.S. PATENT DOCUMENTS

| | | | |
|---|---|---|---|
| 9,881,929 B1 | 1/2018 | Ravikirthi et al. | |
| 10,115,632 B1 | 10/2018 | Masamori et al. | |
| 10,483,277 B2* | 11/2019 | Nishimura | H01L 27/11565 |
| 10,685,708 B2* | 6/2020 | Jeon | H01L 27/10832 |
| 10,847,523 B1* | 11/2020 | Yeh | H01L 27/11507 |
| 10,847,540 B2* | 11/2020 | Or-Bach | H01L 29/7926 |
| 10,943,913 B2* | 3/2021 | Huang | H01L 27/11521 |
| 11,233,062 B2* | 1/2022 | Kim | H01L 27/10876 |
| | | | 257/302 |
| 2012/0081958 A1 | 4/2012 | Lee et al. | |
| 2014/0327067 A1 | 11/2014 | Chae et al. | |
| 2015/0372101 A1 | 12/2015 | Lee et al. | |
| 2017/0213845 A1 | 7/2017 | Baba | |
| 2018/0122819 A1 | 5/2018 | Shim et al. | |
| 2019/0027490 A1 | 1/2019 | Shin et al. | |
| 2019/0051599 A1 | 2/2019 | Zhang et al. | |
| 2019/0067182 A1 | 2/2019 | Lee | |
| 2019/0139979 A1 | 5/2019 | Kanamori et al. | |

FOREIGN PATENT DOCUMENTS

| | | |
|---|---|---|
| KR | 20180049593 A | 5/2018 |
| KR | 20190009070 A | 1/2019 |

* cited by examiner

SEMICONDUCTOR DEVICE

CROSS-REFERENCE TO RELATED APPLICATION(S)

This application is a continuation of U.S. application Ser. No. 16/827,778, filed Mar. 24, 2020, now U.S. Pat. No. 11,233,062, which claims benefit of priority under 35 U.S.C. § 119 to Korean Patent Application No. 10-2019-0094345, filed on Aug. 2, 2019, in the Korean Intellectual Property Office, the entire disclosures of both of which are incorporated herein by reference.

BACKGROUND

Example embodiments of the present inventive concept relate to a semiconductor device.

Semiconductor devices having reduced volume and a capability to process high capacity data are being demanded. Accordingly, to meet these demands, integration density of semiconductor elements included in semiconductor devices has been improved. As one method for improving integration density of semiconductor devices, a semiconductor device having a vertical transistor structure, instead of a general planar transistor structure, has been suggested.

SUMMARY

An example embodiment of the present inventive concept is to provide a semiconductor device having improved reliability.

According to an example embodiment of the present inventive concept, a semiconductor device includes a substrate having first and second regions; gate electrodes spaced apart from each other and stacked in a first direction perpendicular to an upper surface of the substrate in the first region, extending in a second direction perpendicular to the first direction by different lengths in the second region, and including at least one ground select gate electrode, memory cell gate electrodes, and at least one string select gate electrode stacked in order from the substrate; first separation regions penetrating through the gate electrodes and extending in the second direction in the first and second regions, and spaced apart from each other in a third direction perpendicular to the first and second directions; second separation regions penetrating through the gate electrodes and extending in the second direction between the first separation regions, and spaced apart from each other in the second direction in the second region; a lower separation region penetrating through the at least one ground select gate electrode between the second separation regions and separating the at least one ground select gate electrode along with the second separation regions; a substrate insulating layer disposed in the substrate between the first separation regions and the second separation regions in the second region; channel structures penetrating through the gate electrodes and extending perpendicularly to the substrate in the first region; and a first dummy channel structure penetrating through the gate electrodes and the substrate insulating layer and extending perpendicularly to the substrate on an external side of the lower separation region in the third direction.

According to an example embodiment of the present inventive concept, a semiconductor device includes a substrate having a conductive region and an insulating region; gate electrodes including sub-gate electrodes spaced apart from each other and stacked in a first direction perpendicular to an upper surface of the substrate and extending in a second direction perpendicular to the first direction and gate connectors connecting the sub-gate electrodes disposed on the same level; channel structures penetrating through the gate electrodes and extending in the conductive region of the substrate; and a first dummy channel structure penetrating through the gate electrodes and extending in the insulating region of the substrate and disposed adjacent to at least one side of the gate connectors in a third direction perpendicular to the first and second directions.

According to an example embodiment of the present inventive concept, a semiconductor device includes a substrate having first and second regions; gate electrodes spaced apart from each other and stacked in a first direction perpendicular to an upper surface of the substrate in the first region, and extending in a second direction perpendicular to the first direction by different lengths and providing pad regions in the second region; penetration separation regions penetrating through the gate electrodes and extending in the second direction in the first and second regions, and spaced apart from each other in the second direction in the second region; a lower separation region penetrating through at least one gate electrode including a lowermost gate electrode between the penetration separation regions; a substrate insulating layer disposed in a portion of the substrate in the second region; channel structures penetrating through the gate electrodes and extending perpendicularly to the substrate in the first region; and dummy channel structures penetrating through the gate electrodes and at least portions of the substrate insulating layer and extending perpendicularly to the substrate in the second region, and including a first dummy channel structure disposed adjacent to the lower separation region around the lower separation region and second dummy channel structures disposed in a regular pattern in the pad regions of the gate electrodes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
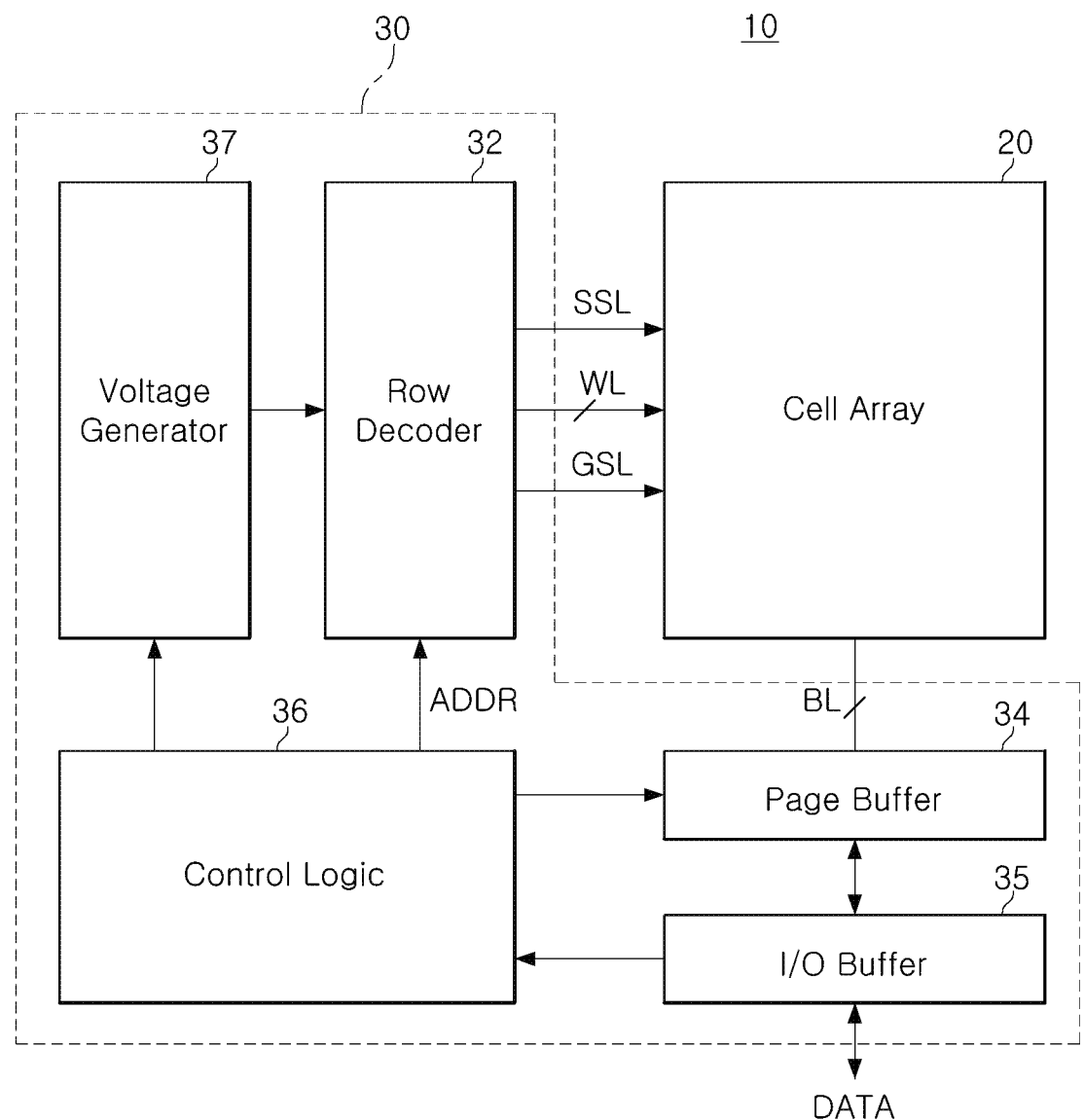
FIG. 1 is a block diagram illustrating a semiconductor device according to an example embodiment of the present inventive concept.

Hereinafter, embodiments of the present inventive concept will be described as follows with reference to the accompanying drawings. In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

FIG. 1 is a block diagram illustrating a semiconductor device according to an example embodiment.

Referring to FIG. 1, a semiconductor device 10 may include a memory cell array 20 and a peripheral circuit 30. The peripheral circuit 30 may include a row decoder 32, a page buffer 34, an input and output buffer 35, a control logic 36, and a voltage generator 37.

Figure 2:
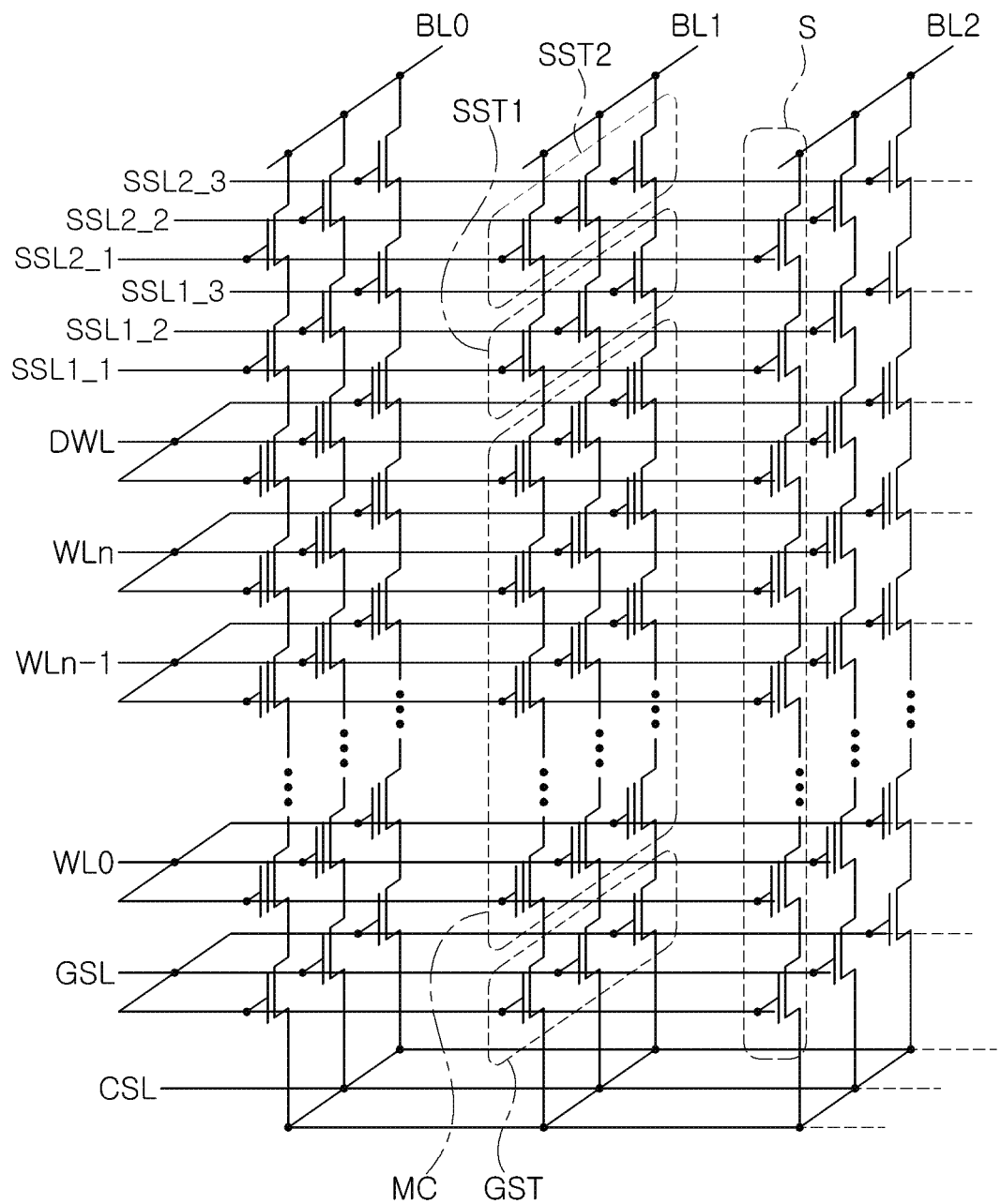
FIG. 2 is an equivalent circuit diagram illustrating a cell array of a semiconductor device according to an example embodiment of the present inventive concept.

FIG. 2 is an equivalent circuit diagram illustrating a cell array of a semiconductor device according to an example embodiment.

Referring to FIG. 2, a memory cell array 20 may include a plurality of memory cell strings S, each including memory cells MC connected to each other in series, and a ground select transistor GST and string select transistors SST1 and SST2 connected to both ends of the memory cells MC in series. The plurality of memory cell strings S may be connected to bit lines BL0 to BL2 in parallel, respectively. The plurality of memory cell strings S may be connected to a common source line CSL in common. Accordingly, the plurality of memory cell strings S may be disposed between the plurality of bit lines BL0 to BL2 and a single common source line CSL. In an example embodiment, a plurality of the common source lines CSL may be arranged two-dimensionally.

The memory cell array 20 may further include a ground select line GSL connected to the ground select transistors GST of each memory cell string S, and a plurality of word lines WL0 . . . WLn−1, WLn connected to memory cells MC of the memory cell strings S. In addition, a dummy word line DWL may be provided below the string select lines SSL1 (e.g., string select lines SSL1_1, SSL1_2, and SSL1_3) and may be connected to the memory cells MC immediately below the string select transistors SST1 in the memory cell strings S. In some embodiments, the memory cell MC immediately below the string select transistor SST1 in a given memory cell string S may be a dummy memory cell.

Figure 3A:
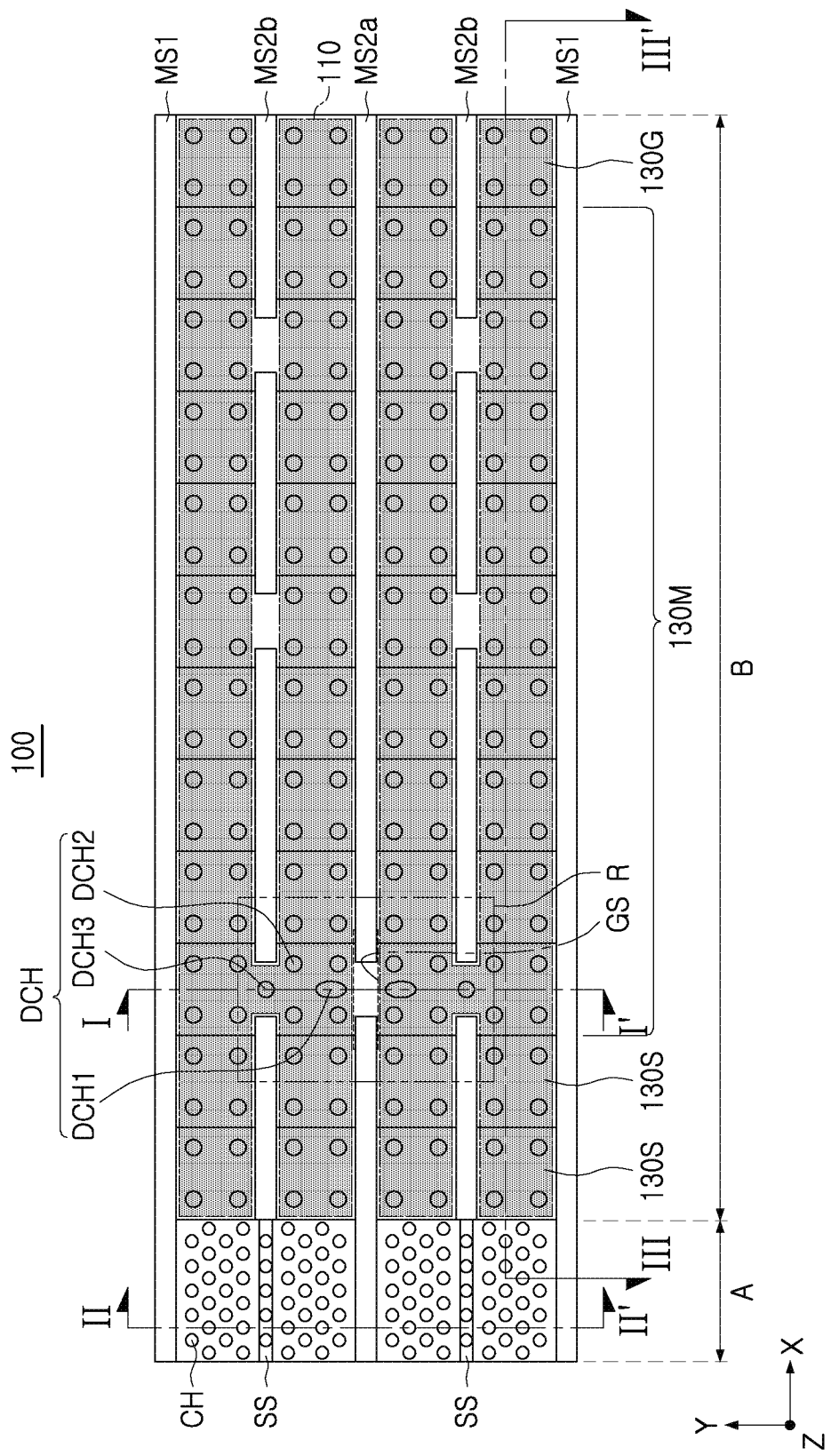
FIGS. 3A to 3C are plan diagrams illustrating a semiconductor device according to an example embodiment of the present inventive concept.
Figure 3B:
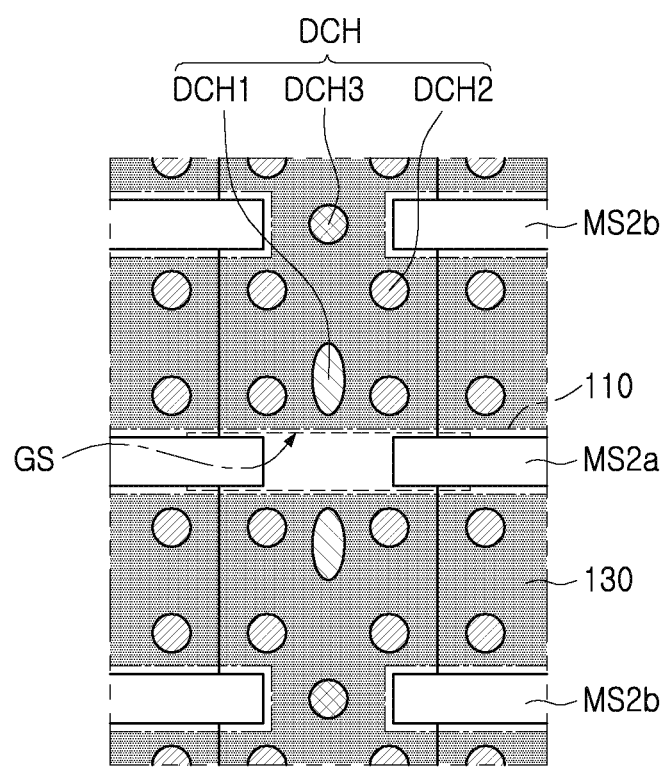
Figure 3C:
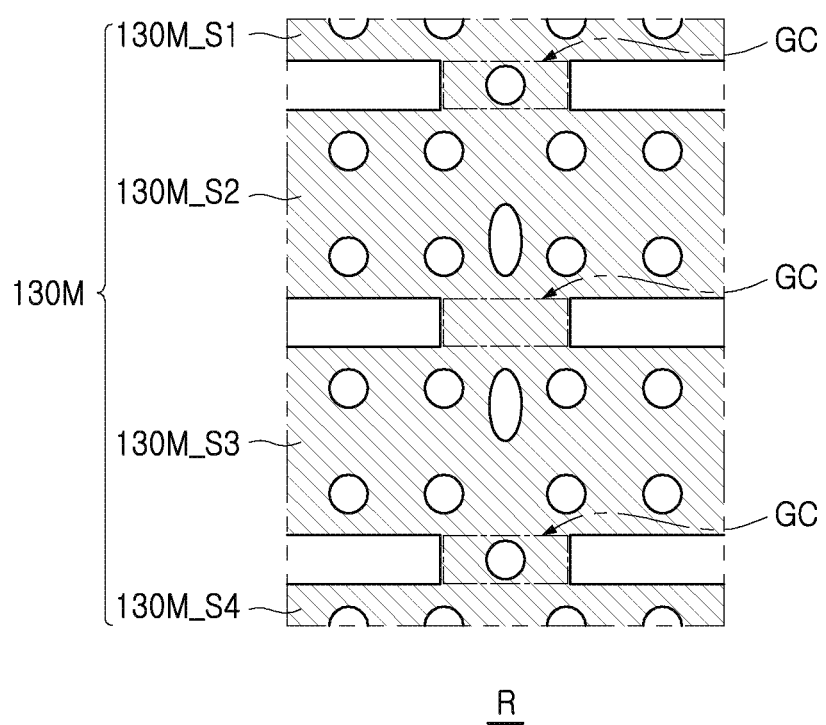

FIGS. 3A to 3C are plan diagrams illustrating a semiconductor device according to an example embodiment. FIG. 3B illustrates region "R" illustrated in FIG. 3A, and FIG. 3C only illustrates a single memory gate electrode 130M in the region "R". In FIGS. 3A and 3B, only main elements of a semiconductor device 100 are illustrated for ease of description.

Figure 4A:
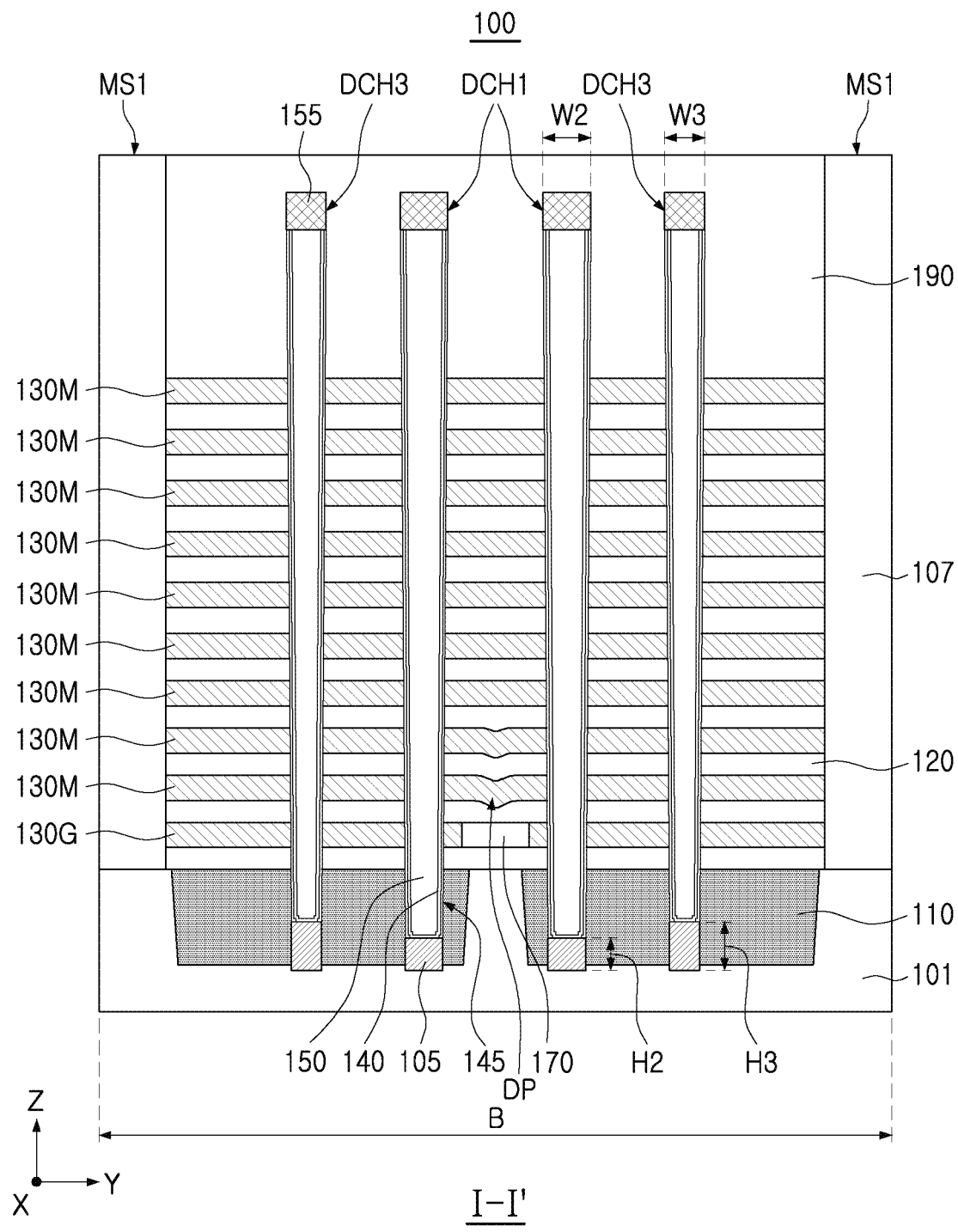
FIGS. 4A to 4C are cross-sectional diagrams illustrating a semiconductor device according to an example embodiment of the present inventive concept.
Figure 4B:
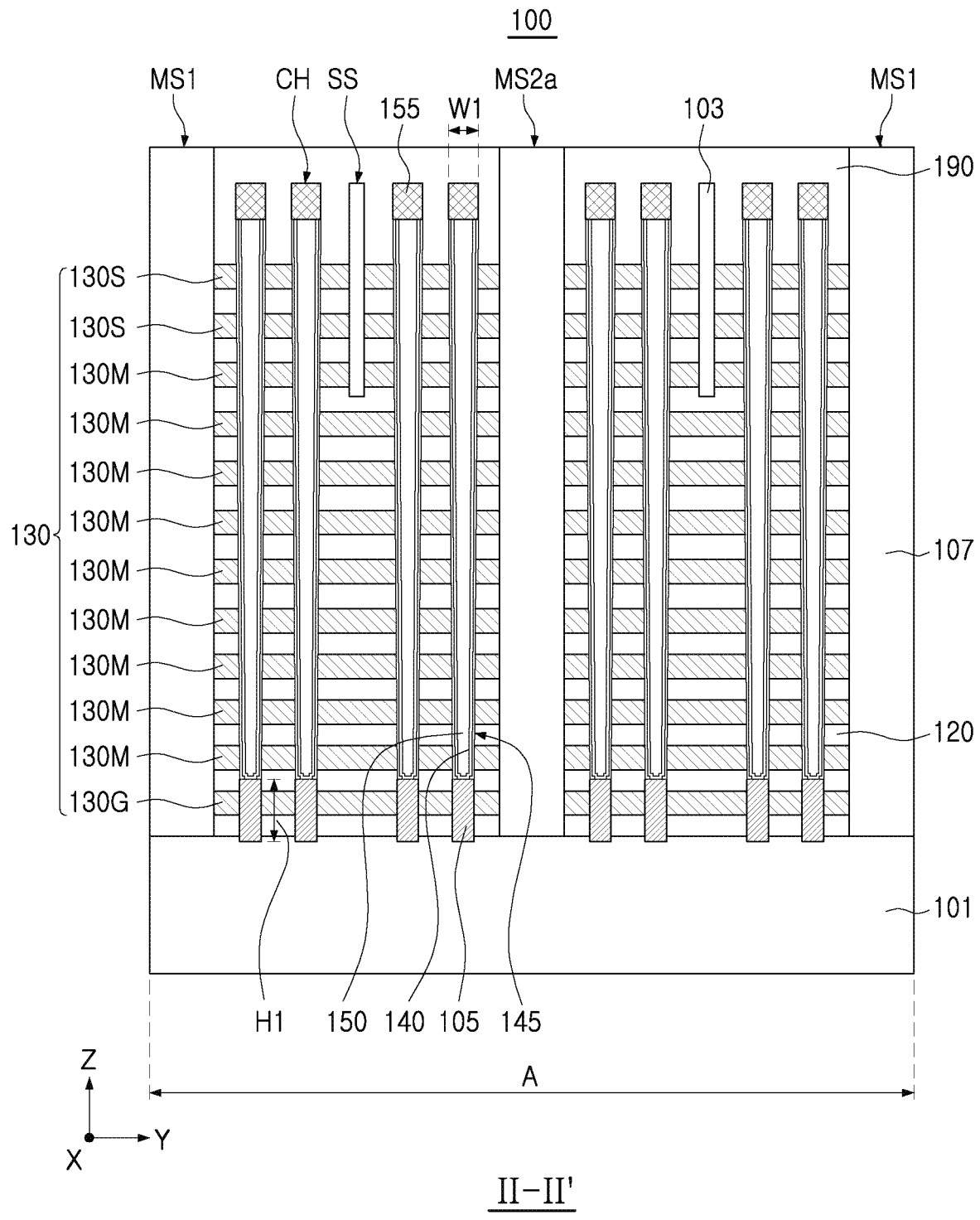
Figure 4C:
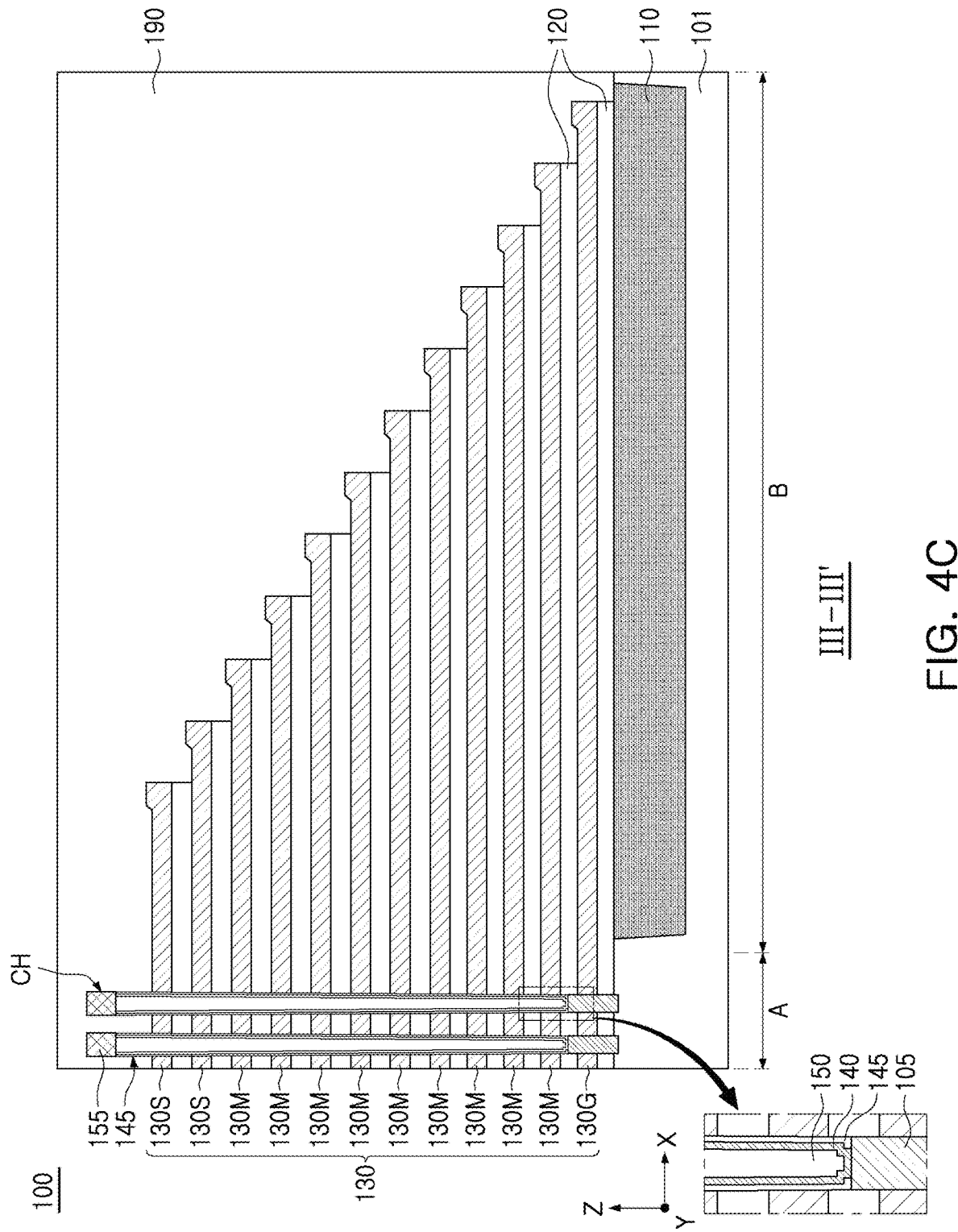

FIGS. 4A to 4C are cross-sectional diagrams illustrating a semiconductor device according to an example embodiment. FIGS. 4A, 4B, and 4C illustrate cross-sectional surfaces taken along lines I-I', II-II', and III-III' in FIG. 3A, respectively.

Referring to FIGS. 3A to 4C, the semiconductor device 100 may include a substrate 101 having a first region A and a second region B, a substrate insulating layer 110 disposed in the substrate 101 in the second region B, gate electrodes 130 stacked on the substrate 101, channel structures CH and dummy channel structures DCH penetrating through the gate electrodes 130, first and second separation regions MS1, MS2a, and MS2b penetrating through the gate electrodes 130, upper separation regions SS penetrating through a portion of the gate electrodes 130 disposed in an uppermost portion, and a lower separation region GS penetrating through a portion of at least one gate electrode 130 disposed in a lowermost portion. The channel structures CH may include a channel layer 140, a gate dielectric layer 145, a channel insulating layer 150, and a channel pad 155. The semiconductor device 100 may further include interlayer insulating layers 120 alternately stacked with the gate electrodes 130 on the substrate 101 and a cell region insulating layer 190 on the interlayer insulating layers 120 and the gate electrodes 130.

In a first region A of the substrate 101, the gate electrodes 130 may be stacked vertically and the channel structures CH may be disposed. The first region A may correspond to the memory cell array 20 illustrated in FIG. 1. In a second region B, the gate electrodes 130 may extend by different lengths and the dummy channel structures DCH may be disposed. The second region B may electrically connect the memory cell array 20 to the peripheral circuit 30, illustrated in FIG. 1. The second region B may be disposed on at least one end of the first region A in at least one direction, e.g., in an x direction. For example, the second region B may be disposed adjacent to the first region A in at least one direction.

The substrate 101 may have an upper surface extending in an x direction and a y direction. The substrate 101 may include a semiconductor material, such as an IV group semiconductor, a III-V group compound semiconductor, or a II-VI group compound semiconductor, for example. For instance, an IV group semiconductor may include silicon, germanium, or silicon-germanium. The substrate 101 may be provided as a bulk wafer or an epitaxial layer.

A substrate insulating layer 110 may be disposed in the substrate 101 in the second region B of the substrate 101. As illustrated in FIGS. 3A and 3B, the substrate insulating layer 110 may be disposed between the first separation regions MS1, the second central separation regions MS2a, the lower separation region GS, and the second auxiliary separation regions MS2b. The substrate insulating layer 110 may not extend to a spacing region between the second central separation regions MS2a along the x direction. The substrate insulating layer 110 may extend to a portion of spacing regions between the second auxiliary separation regions MS2b along the x direction (e.g., a spacing region between adjacent ones of the second auxiliary separation regions MS2b nearest to the first region A), and the substrate insulating layer 110 may not extend to the other spacing regions. Alternatively, in example embodiments, the substrate insulating layer 110 may extend to all of the spacing regions between the second auxiliary separation regions MS2*b* along the x direction.

The substrate insulating layer 110 may be formed by a shallow trench isolation (STI) process, for example. The substrate insulating layer 110 may extend into the substrate 101 from an upper surface of the substrate 101 by a certain depth. The substrate insulating layer 110 may be formed of an insulating material, and may include oxide, nitride, or combinations thereof, for example. The substrate insulating layer 110 may also be described as being included in an insulating region of the substrate 101, and in this case, the substrate 101 may include an insulating region corresponding to the substrate insulating layer 110 and a conductive region formed by a semiconductor region.

The gate electrodes 130 may be spaced apart from each other and stacked perpendicularly on the first region A, and may extend from the first region A to the second region B by different lengths. The gate electrodes 130 may include a ground select gate electrode 130G included in a gate of the ground select transistor GST, memory cell gate electrodes 130M included in a plurality of memory cells MC, and string select gate electrodes 130S included in gates of string select transistors SST1 and SST2. The number of the memory cell gate electrodes 130M included in the memory cells MC may be determined in accordance with a capacity of the semiconductor device 100. In an example embodiment, the number of string select gate electrodes 130S of the string select transistor SST1 and SST2 may be one or two, and the number of ground select gate electrodes 130G of the ground select transistor GST may be one or two. Each of the string select gate electrodes 130S and the ground select gate electrodes 130G may have a structure the same as or different from a structure of memory cell gate electrodes 130M of the memory cells MC. One or more of the gate electrodes 130 (e.g., the memory cell gate electrodes 130M adjacent to the ground select gate electrode 130G and/or the memory cell gate electrodes 130M adjacent to the string select gate electrodes 130S) may be configured as dummy gate electrodes.

As illustrated in FIGS. 3A and 3C, the gate electrodes 130 may be divided in the y direction by the first separation regions MS1 extending in the x direction. The gate electrodes 130 between a pair of the first separation regions MS1 may form a single memory block, but an example range of the memory block is not limited thereto. A portion of the gate electrodes 130 (e.g., the memory cell gate electrodes 130M) may form a single layer in a single memory block. For example, as illustrated in FIG. 3C, each of the memory cell gate electrodes 130M may include four sub-gate electrodes 130M_S1, 130M_S2, 130M_S3, and 130M_S4 extending lengthwise in the x direction, and the four sub-gate electrodes 130M_S1, 130M_S2, 130M_S3, and 130M_S4 may be connected to each other by gate connectors GC in the spacing regions between the second separation regions MS2*a* and MS2*b* along the x direction and may be disposed as a single layer. The gate connectors GC may refer to a region of the gate electrodes 130 in which the gate electrodes 130 are connected horizontally on the same level. The string select gate electrodes 130S may be divided into four sub-gate electrodes by the first and second separation regions MS1, MS2*a*, and MS2*b* between a pair of the first separation regions MS1. For example, the four sub-gate electrodes of the string select gate electrodes 130S may not be connected to one another by gate connectors GC in the spacing regions between the second separation regions MS2*a* and MS2*b*. The ground select gate electrode 130G may include sub-gate electrodes connected to each other by the gate connectors GC between portions of the second separation regions MS2*a* and MS2*b*, and may be divided into two sub-gate electrodes by the lower separation region GS between the second central separation regions MS2*a*.

As illustrated in FIG. 4C, the gate electrodes 130 may extend lengthwise in the x direction by different lengths and may form stepped portions in staircase form in the second region B of the substrate 101, and may provide pad regions in which the gate electrode 130 in a lower portion is exposed upwardly. For example, the pad region of a gate electrode 130 may be that portion of the gate electrode 130 that is not overlapped by one or more of the other gate electrodes 130 disposed above the gate electrode 130 in the z-direction. In example embodiments, the gate electrodes 130 may also form stepped portions in the y direction. Each gate electrodes 130 may be connected to a contact plug (not illustrated) in its pad region, and accordingly, the gate electrodes 130 may be connected to a wiring structure in an upper portion. In the pad regions, the gate electrodes 130 may have a region in which thicknesses of the gate electrodes 130 increase to be stably connected to the contact plugs, but an example embodiment is not limited thereto.

The gate electrodes 130 may include a metal material, tungsten (W), for example. In example embodiments, the gate electrodes 130 may include polycrystalline silicon or a metal silicide material. In example embodiments, the gate electrodes 130 may further include a diffusion barrier, and the diffusion barrier may include tungsten nitride (WN), tantalum nitride (TaN), titanium nitride (TiN), or combinations thereof.

The interlayer insulating layers 120 may be disposed between the gate electrodes 130. The interlayer insulating layers 120 may also be spaced apart from each other in a direction perpendicular to an upper surface of the substrate 101 and may extend lengthwise in the x direction, similarly to the gate electrodes 130. The interlayer insulating layers 120 may include an insulating material such as silicon oxide or silicon nitride.

The first and second separation regions MS1, MS2*a*, and MS2*b* may extend lengthwise in the x direction in the first region A and the second region B. The first and second separation regions MS1, MS2*a*, and MS2*b* may be disposed in parallel to one another. The first separation regions MS1 and the second separation region MS2*a* and MS2*b* may form a certain pattern in the y direction, and the second separation region MS2*a* and MS2*b* may be spaced apart from each other linearly in the x direction. The first and second separation regions MS1, MS2*a*, and MS2*b* may be configured as a penetration separation region penetrating through all of the gate electrodes 130 stacked on the substrate 101 and may be connected to the substrate 101. For example, lower surfaces of each of the first and second separation regions MS1, MS2*a*, and MS2*b* may contact an upper surface of the substrate 101.

The second separation region MS2*a* and MS2*b* may include the second central separation regions MS2*a* disposed between a pair of the first separation regions MS1 and the second auxiliary separation regions MS2*b* disposed between the first separation region MS1 and the second central separation region MS2*a*. The second central separation regions MS2*a* may be disposed across the first region A and the second region B, and the second auxiliary separation regions MS2*b* may only be disposed in the second region B. The second central separation regions MS2*a* may extend from the first region A to a portion of the second region B as a single region, and may be spaced apart from each other in the second region B and may extend as a single region again. For example, each second central separation region MS2a may be comprised of two segments that extend lengthwise in the x direction and are adjacent to one another, and a short sidewall of the first segment (e.g., the segment that extends lengthwise from the first region A to the portion of the second region B) may face a short sidewall of the second segment of the second separation region MS2a (e.g., the segment that extends lengthwise within the second region B). The second auxiliary separation regions MS2b may be linearly separated from each other by a certain gap and a plurality of the second auxiliary separation regions MS2b may be disposed. For example, each second auxiliary separation region MS2b may be comprised of a plurality of segments that extend lengthwise in the x direction and are adjacent to one another. In some embodiments, a first segment (e.g., a segment nearest the first region A) of the second auxiliary separation region MS2b may have a first short sidewall that faces the first region A and a second short sidewall that faces a first short sidewall of the adjacent second segment of the second auxiliary separation region MS2b. The second segment of the second auxiliary separation region MS2b may include the first short sidewall that faces the first segment and a second short sidewall that faces a first short sidewall of the adjacent third segment of the second auxiliary separation region MS2b. The remaining segments of the second auxiliary separation region MS2b may be similarly arranged. An arrangement order and the number of the first and second separation regions MS1, MS2a, and MS2b may not be limited to the examples illustrated in FIG. 3A. For example, in example embodiments, the second separation region MS2a and MS2b may be disposed in four or more columns between a pair of the first separation regions MS1 in the y direction.

As illustrated in FIGS. 4A and 4B, the first and second separation regions MS1, MS2a, and MS2b may include a separation layer 107. The separation layer 107 may only include an insulating material, or may include an insulating material and a conductive material. In example embodiments, when the separation layer 107 includes a conductive layer spaced apart from the gate electrodes 130 by the insulating layer, the first separation regions MS1 may include the common source line CSL described with reference to FIG. 2, and the second separation region MS2a and MS2b may include a dummy common source line. In this case, the dummy common source line may be in a floating state in which the dummy common source line is not connected to elements for driving the semiconductor device 100 and/or an electrical signal is not applied. In example embodiment, when the separation layer 107 only includes an insulating layer, the common source line CSL may be disposed in the substrate 101 or may be disposed on the substrate 101 to be in contact with an upper surface of the substrate 101.

The upper separation regions SS may extend lengthwise in the x direction between the first separation regions MS1 and the second central separation region MS2a in the first region A. The upper separation regions SS may be disposed side by side with the second auxiliary separation region MS2b. The upper separation regions SS may penetrate portions of the gate electrodes 130 including the string select gate electrodes 130S. The string select gate electrodes 130S separated by the upper separation regions SS may form different string select lines SSL1_1, SSL1_2, SSL1_3, SSL2_1, SSL2_2, and SSL2_3 (see FIG. 2). In some embodiments, the upper separation regions SS may further penetrate an uppermost one of the memory cell gate electrodes 130M. In such embodiments, the uppermost one of the memory cell gate electrodes 130M separated by the upper separation regions SS may be a dummy gate electrode.

The upper separation regions SS may include an upper insulating layer 103. As illustrated in FIG. 4B, the upper insulating layer 103 may separate three gate electrodes 130 (e.g., two string select gate electrodes 130S and the uppermost one of the memory cell gate electrodes 130M) from one another in the y direction. The number of the gate electrodes 130 separated from one another by the upper insulating layer 103 may be varied in example embodiments.

The lower separation region GS may be disposed on a level the same as a level of the ground select gate electrode 130G disposed in a lowermost portion. The lower separation region GS and the ground select gate electrode 130G may have the same thicknesses. For example, upper surfaces of the lower separation region GS and the ground select gate electrode 130G may be coplanar with one another, and lower surfaces of the lower separation region GS and the ground select gate electrode 130G may be coplanar with one another. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The ground select gate electrode 130G may be divided into two sections in the y direction between a pair of the first separation regions MS1. For example, a first section may be between a first one of the first separation regions MS1 and the lower separation region GS, and a second section may be between the lower separation region GS and a second one of the first separation regions MS1. The lower separation region GS may connect the second central separation regions MS2a to each other along with a spacing region between the second central separation regions MS2a.

As illustrated in FIG. 4A, the lower separation region GS may include a lower insulating layer 170. The lower insulating layer 170 may be formed of silicon oxide, for example, and may be formed of a material the same as a material of the interlayer insulating layers 120. At least portions of the interlayer insulating layers 120 and the gate electrodes 130 above the lower separation region GS may have a recess portion DP formed towards a central of the lower separation region GS in an upper portion of the lower separation region GS. In a region distant from the lower separation region GS (e.g., in the z direction), the interlayer insulating layers 120 and the gate electrodes 130 may have the recess portion DP having smoothed curvatures or may not have the recess portion DP. For example, the interlayer insulating layers 120 and the gate electrodes 130 nearer to the lower separation region GS may have larger recess portions DP, whereas the interlayer insulating layers 120 and the gate electrodes 130 farther from the lower separation region GS may have smaller or nonexistent recess portions DP. In example embodiments, the recess portion DP may not be formed depending on a process for forming the lower separation region GS, and the interlayer insulating layers 120 on the lower separation region GS may have a planar upper surface.

The channel structures CH may form rows and columns, when viewed in plan view, and may be spaced apart from each other on the first region A. The channel structures CH may be disposed in a lattice pattern, or may be disposed in a zig-zag pattern in one direction. Each of the channel structures CH may have a columnar shape, and may have an inclined side surface and have a width decreasing towards the substrate 101 in accordance with an aspect ratio. In example embodiments, the channel structures CH disposed on an end of the first region A adjacent to the second region B may be dummy channels. The channel structures CH overlapping the upper separation regions SS may also be dummy channels. In this case, each of the dummy channels DCH may have a structure the same as or similar to a structure of each of the channel structures CH and may be formed at the same time and through the same processes as the channel structures CH, but may not have a substantial function in the semiconductor device 100. For example, dummy channel structures DCH are not effective to function for read or write operations (e.g., dummy channel structures DCH may not be electrically connected to bit line contacts, and therefore cannot connect to bit lines).

Referring to the enlarged diagram in FIG. 4C, a channel layer 140 may be disposed in the channel structures CH. In the channel structures CH, the channel layer 140 may have an annular shape surrounding the channel insulating layer 150 disposed therein, but in example embodiments, the channel layer 140 may have a columnar shape such as a cylindrical shape or a prism shape without the channel insulating layer 150. The channel layer 140 may be connected to an epitaxial layer 105 disposed in a lower portion of the channel structures CH. The channel layer 140 may include a semiconductor material such as polycrystalline silicon or single crystalline silicon, and the semiconductor material may be an undoped material, or a material including p-type impurities or n-type impurities. The channel structures CH disposed linearly in the y direction may be connected to different bit lines BL0 to BL2 (see FIG. 2) in accordance with an arrangement of an upper wiring structure connected to the channel pad 155.

The channel pad 155 may be disposed in an upper portion of the channel layer 140 in the channel structures CH. The channel pad 155 may cover an upper surface of the channel insulating layer 150 and may be electrically connected to the channel layer 140. The channel pad 155 may include doped polycrystalline silicon, for example.

The gate dielectric layer 145 may be disposed between the gate electrodes 130 and the channel layer 140. Although not illustrated in detail, the gate dielectric layer 145 may include a tunneling layer, an electric charge storage layer, and a blocking layer stacked in order from the channel layer 140. The tunneling layer may tunnel an electric charge to the electric charge storage layer. For example, the tunneling layer may include silicon oxide ($SiO_2$), silicon nitride ($Si_3N_4$), silicon oxy-nitride (SiON), or combinations thereof, for example. The electric charge storage layer may be an electric charge trapping layer or a floating gate conductive layer. The blocking layer may include silicon oxide ($SiO_2$), silicon nitride ($Si_3N_4$), silicon oxy-nitride (SiON), a high-k dielectric material, or combinations thereof. In example embodiments, at least a portion of the gate dielectric layer 145 may extend in a horizontal direction along the gate electrodes 130.

The epitaxial layer 105 may be disposed on the substrate 101 on a lower end of the channel structures CH, and may be disposed on a side surface of at least one gate electrode 130. The epitaxial layer 105 may be disposed in a recessed region of the substrate 101. A height of an upper surface of the epitaxial layer 105 may be higher than an upper surface of a lowermost gate electrode 130, and may be lower than a lower surface of a gate electrode 130 on an upper portion thereof (e.g., a gate electrode 130 immediately above the lowermost gate electrode 130), but an example embodiment thereof is not limited thereto. In example embodiments, the epitaxial layer 105 may not be provided, and in this case, the channel layer 140 may be directly connected to the substrate 101.

The dummy channel structures DCH may be disposed in the second region B, and each of the dummy channel structures DCH may have a structure the same as or similar to a structure of each of the channel structures CH, but the dummy channel structures DCH may not have a substantial function in the semiconductor device 100. The dummy channel structures DCH may penetrate the substrate insulating layer 110 and may be connected to the substrate 101. For example, the dummy channel structures DCH may extend through the lower surface of the substrate insulating layer 110. The dummy channel structures DCH may include first dummy channel structures DCH1 disposed on an external side of the lower separation region GS taken in the y direction, second dummy channel structures DCH2 forming rows and columns and disposed in a regular pattern in the pad regions of the gate electrodes 130, and third dummy channel structures DCH3 disposed in at least a portion of a spacing region between the second auxiliary separation regions MS2b along the x direction. As described above, the channel structures CH may also include dummy channel structures in the first region A.

The first dummy channel structures DCH1 may be disposed on both sides of the lower separation region GS in the y direction. The first dummy channel structures DCH1 may be disposed between the second dummy channel structures DCH2 adjacent to each other in the x direction. Each of the first dummy channel structures DCH1 may have a maximum diameter (or width) greater than a maximum diameter (or width) of each of the channel structures CH and the second and third dummy channel structures DCH2 and DCH3. For example, the first dummy channel structures DCH1 may have a maximum diameter of a second width W2 greater than a first width W1, which is a maximum diameter of each of the channel structures CH, and the second width W2 may be greater than a third width W3, which is a maximum diameter of each of the third dummy channel structures DCH3. The second width W2 may also be greater than a maximum diameter of each of the second dummy channel structures DCH2. For example, the first width W1 may be within a range of 50 nm to 150 nm approximately, and the second width W2 may be within a range of 120 nm to 220 nm approximately. Each of the channel structures CH and the second and third dummy channel structures DCH2 and DCH3 may have a circular shape or a shape similar to a circular shape, whereas each of the first dummy channel structures DCH1 may have a shape in which a width along the y direction is greater than a width along the x direction. For example, each of the first dummy channel structures DCH1 may have an elliptical shape, an elongated shape, a rectangular shape, or an oval shape.

The second dummy channel structures DCH2 may be arranged in a pattern. When a minimum unit surrounded by the first and second separation regions MS1, MS2a, and MS2b in the pad region is referred to as a unit pad region, the second dummy channel structures DCH2 may be disposed on four corners of a single unit pad region, and four second dummy channel structures DCH2 may be repeatedly disposed in each unit pad region. A maximum diameter of each of the second dummy channel structures DCH2 may be less than a maximum diameter of each of the first dummy channel structures DCH1, and may be the same as or less than a maximum diameter of each of the third dummy channel structures DCH3.

The third dummy channel structures DCH3 may be disposed linearly in the y direction along with the first dummy channel structures DCH1, and may be disposed in a spacing region between the second auxiliary separation regions MS2b along the x direction. In the example embodiment, the third dummy channel structures DCH3 may only be disposed linearly in the y direction along with the first dummy channel structures DCH1, and may not be disposed in the other spacing regions among the second auxiliary separation regions MS2b along the x direction. In this case, as illustrated in FIG. 3A, the substrate insulating layer 110 may not extend to the other spacing regions. In example embodiments, the third dummy channel structures DCH3 may be disposed in overall spacing regions between the second auxiliary separation regions MS2b along the x direction.

As the dummy channel structures DCH penetrate the substrate insulating layer 110, lower ends of the dummy channel structures DCH may be disposed on a level lower than lower ends of the channel structures CH. Accordingly, the dummy channel structures DCH may have a height higher than a height of each of the channel structures CH. Also, at least a portion of a side surface of each of the epitaxial layers 105 in the dummy channel structures DCH may be surrounded by the substrate insulating layer 110. For example, an upper surface of the epitaxial layer 105 of the dummy channel structures may be lower than an upper surface of the substrate insulating layer 110, and a lower surface of the epitaxial layer 105 of the dummy channel structures may be lower than a lower surface of the substrate insulating layer 110. Each of the epitaxial layers 105 in the dummy channel structures DCH may have a relatively low height or a relatively reduced thickness in accordance with diameters of the first to third dummy channel structures DCH1, DCH2, and DCH3, when a diameter of each of the epitaxial layers 105 is relatively great. For example, each of the epitaxial layers 105 in the channel structures CH may have a first height H1, each of the epitaxial layers 105 in the first dummy channel structures DCH1 may have a second height H2, and each of the epitaxial layers 105 in the third dummy channel structures DCH3 may have a third height H3 the same as or lower than the first height H1 and higher than the second height H2.

The dummy channel structures DCH may be configured to support the stack structure including the interlayer insulating layers 120 to prevent collapse during a process of manufacturing the semiconductor device 100. A region in which the lower separation region GS is disposed may be vulnerable to a collapse which may occur during a process of manufacturing the semiconductor device 100. In the example embodiment, although the dummy channel structures DCH may not overlap the lower separation region GS, by disposing the dummy channel structures DCH on both sides of the lower separation region GS, the collapse in an upper portion of the lower separation region GS may be prevented.

Also, as there may be fewer limitations in size of each of the first dummy channel structures DCH1 as compared to the configuration in which the first dummy channel structures DCH1 overlap the lower separation region GS, each of the first dummy channel structures DCH1 may have a relatively increased size, and a defect caused by miss-arrangement, and the like, may be prevented. Further, as the first dummy channel structures DCH1 are spaced apart from a center of the recess portion DP, a defect caused by a structure of the recess portion DP may be prevented. Also, the dummy channel structures DCH penetrate the substrate insulating layer 110 and lower ends of the dummy channel structures DCH may be disposed on a level lower than the channel structures CH, and accordingly, a defect such as shorts or leakage current between the epitaxial layer 105 and the gate electrodes 130 may be prevented.

The cell region insulating layer 190 may be disposed on the stack structure of the gate electrodes 130, and may include an insulating material such as silicon oxide, silicon nitride, and the like.

Figure 5A:
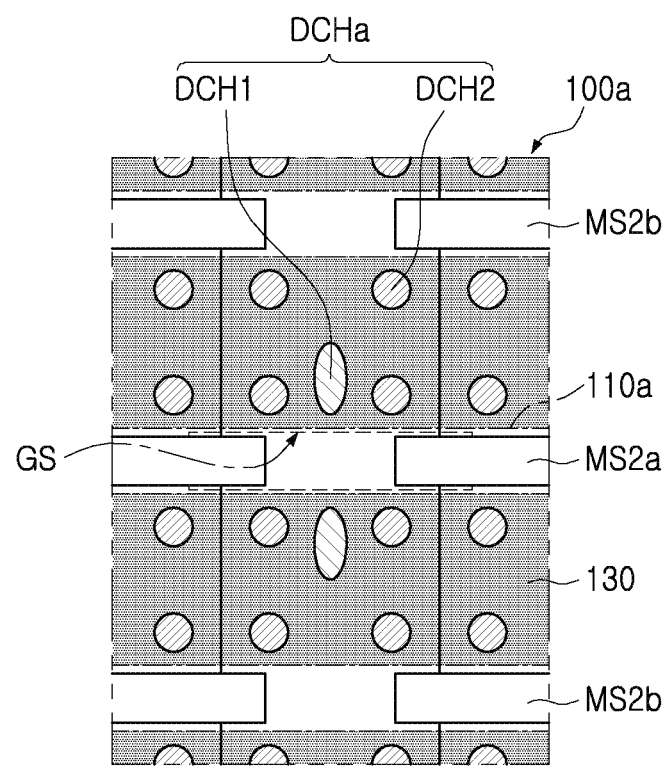
FIGS. 5A to 6B are plan diagrams and cross-sectional diagrams illustrating a semiconductor device according to an example embodiment of the present inventive concept.
Figure 5B:
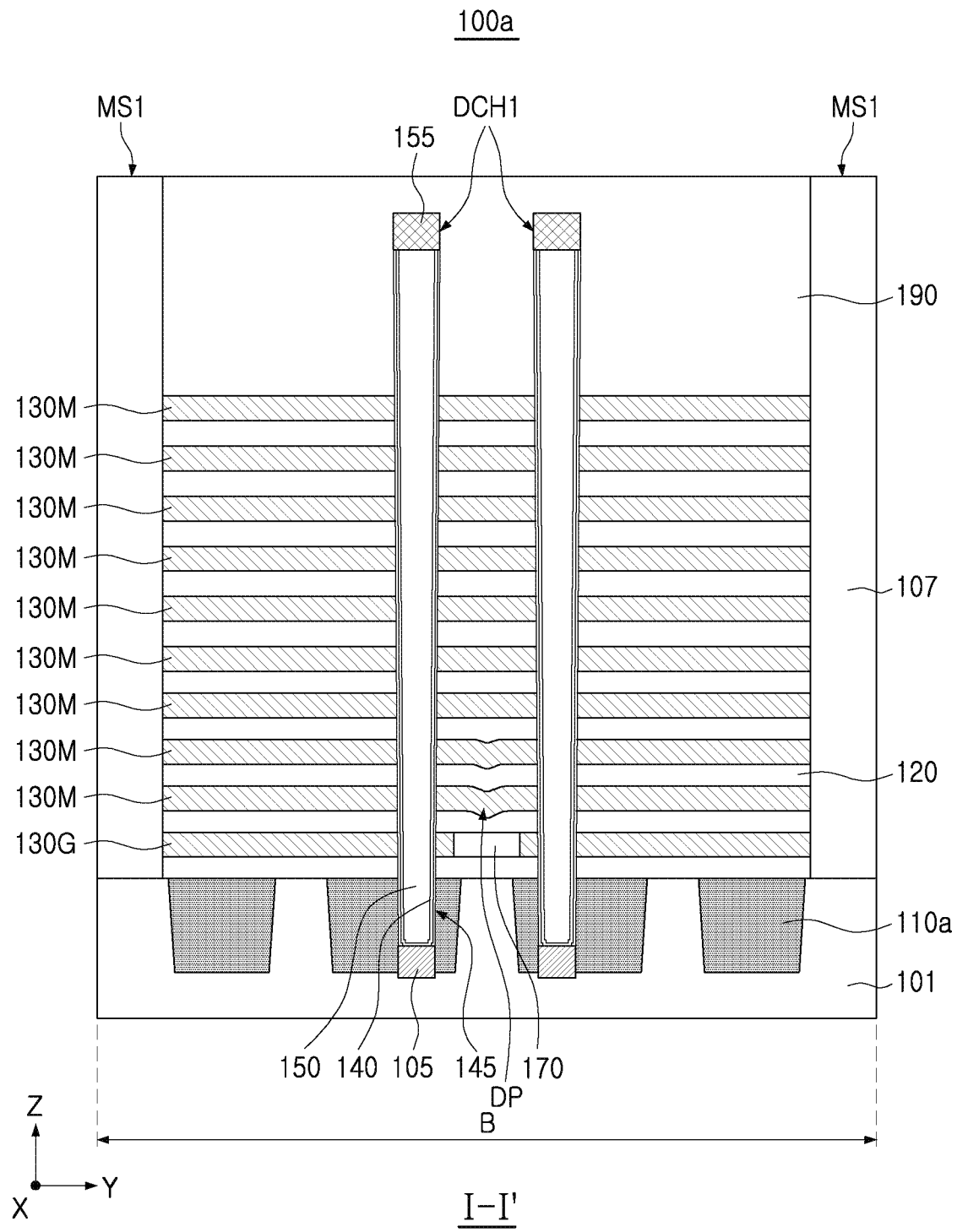
Figure 6A:
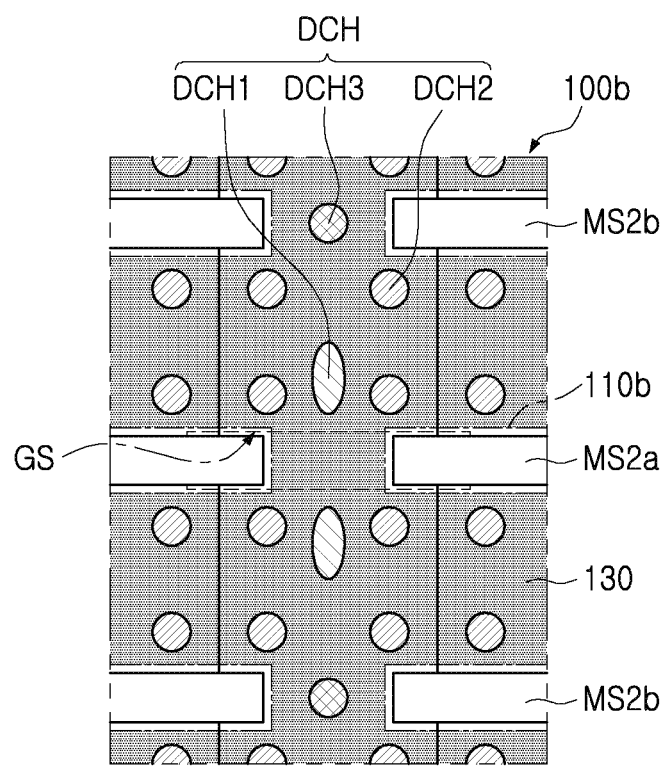
Figure 6B:
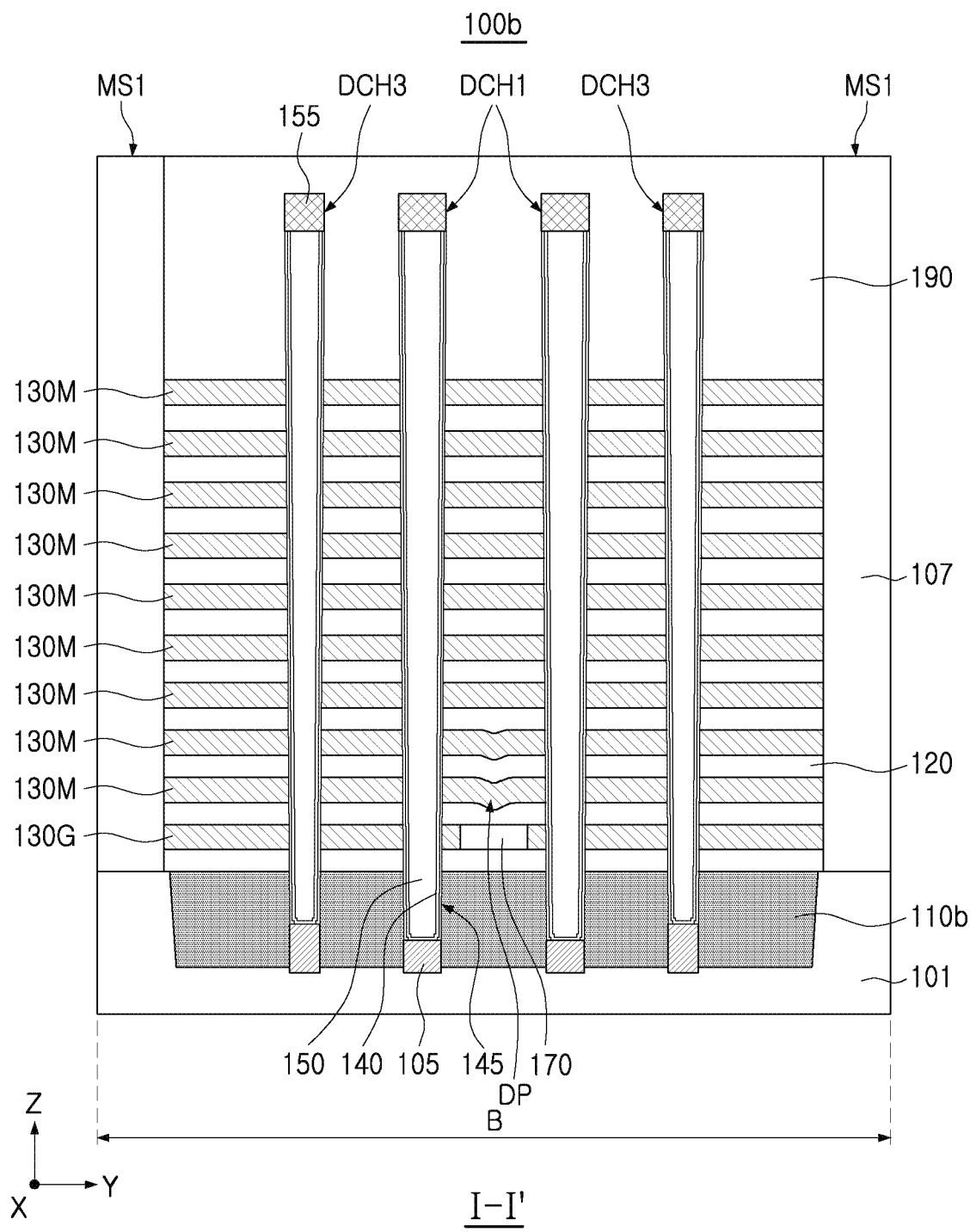

FIGS. 5A to 6B are plan diagrams and cross-sectional diagrams illustrating a semiconductor device according to an example embodiment. FIGS. 5A and 6A illustrate a region corresponding to the region illustrated in FIG. 3B, and FIGS. 5B and 6B illustrate a region corresponding to the region illustrated in FIG. 4A.

Referring to FIGS. 5A and 5B, in a semiconductor device 100a, dummy channel structures DCHa may only include first and second dummy channel structures DCH1 and DCH2. Thus, differently from the example embodiment in FIGS. 3A to 4C, the dummy channel structures DCHa may not include third dummy channel structures DCH3. In this case, in a substrate 101, a substrate insulating layer 110a may not extend to a region between second central separation regions MS2a adjacent to each other in the x direction, and not to a region between second auxiliary separation regions MS2b adjacent to each other in the x direction.

Referring to FIGS. 6A and 6B, differently from the example embodiment illustrated in FIGS. 3A to 4C, in a semiconductor device 100b, a substrate insulating layer 110b may extend to a region between second auxiliary separation regions MS2b adjacent to each other in the x direction and also to a region between second central separation regions MS2a adjacent to each other in the x direction. Accordingly, the substrate insulating layer 110b may overlap a lower separation region GS on a plane or in a z direction.

Figure 7A:
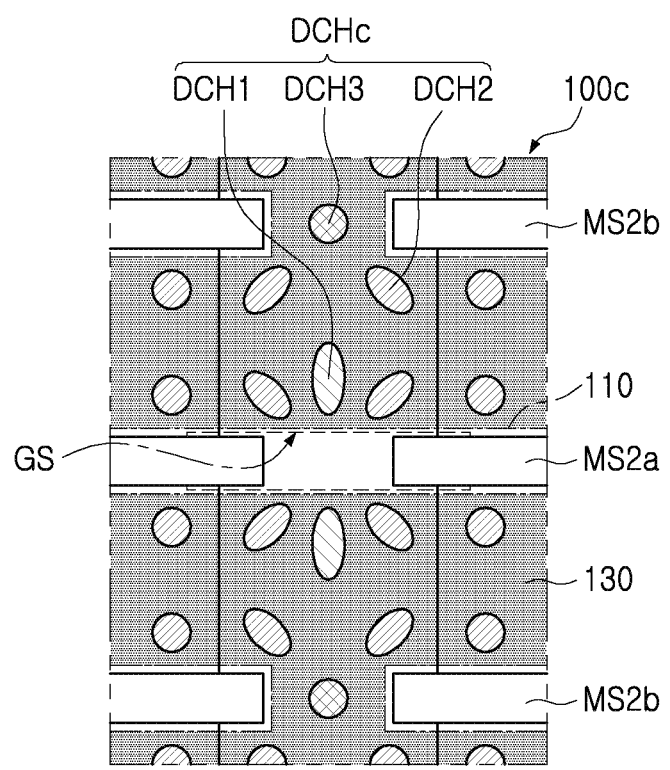
FIGS. 7A and 7B are plan diagrams illustrating a semiconductor device according to an example embodiment of the present inventive concept.
Figure 7B:
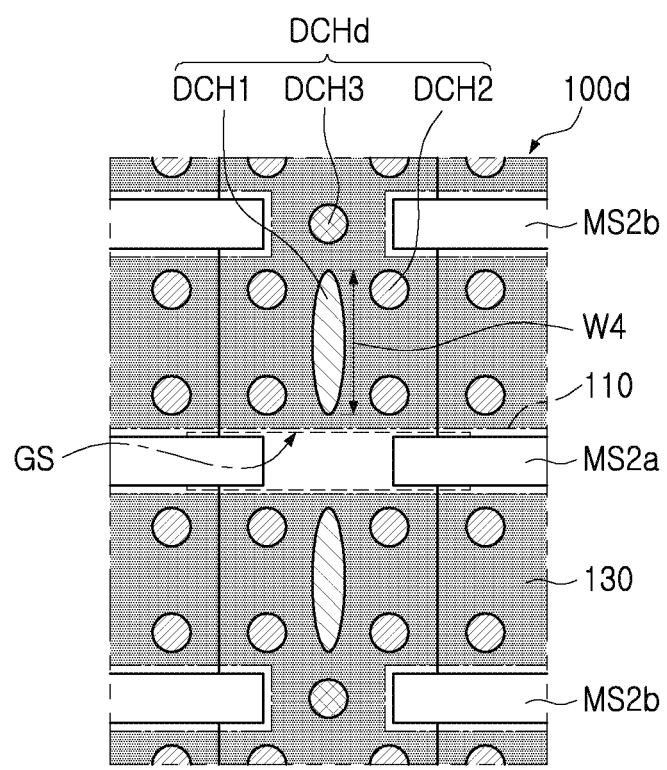

FIGS. 7A and 7B are plan diagrams illustrating a semiconductor device according to an example embodiment. FIGS. 7A and 7B illustrate a region corresponding to the region illustrated in FIG. 3B.

Referring to FIG. 7A, differently from the example embodiment illustrated in FIG. 3B, in a semiconductor device 100c, each of second dummy channel structures DCH2 of dummy channel structures DCHc may have a shape similar to an oval shape, rather than a circular shape. Four second dummy channel structures DCH2 disposed in a single unit pad region may be configured to be tilted in directions towards a center of the unit pad region, respectively. Even in this case, a maximum diameter of each of first dummy channel structures DCH1 may be greater than a maximum diameter of each of the second dummy channel structures DCH2. In example embodiments, shapes of the first to third dummy channel structures DCH1, DCH2, and DCH3 included in the dummy channel structures DCHc may be varied.

Referring to FIG. 7B, differently from the example embodiment in FIG. 3B, in a semiconductor device 100d, each of the first dummy channel structures DCH1 of dummy channel structures DCHc may be configured to have an extended length. Each of the first dummy channel structures DCH1 may have an extended maximum diameter W4 such that the first dummy channel structures DCH1 may be adjacent to extended lines of both ends of second separation region MS2a and MS2b in the y direction between a second auxiliary separation regions MS2b and a second central separation regions MS2a. Accordingly, in a single unit pad region, the first dummy channel structures DCH1 may overlap each of the second dummy channel structures DCH2 in the x direction. In example embodiments, a size and a shape of each of the first dummy channel structures DCH1 may be varied within a range in which the first dummy channel structures DCH1 are spaced apart from the second dummy channel structures DCH2 on both sides.

Figure 8:
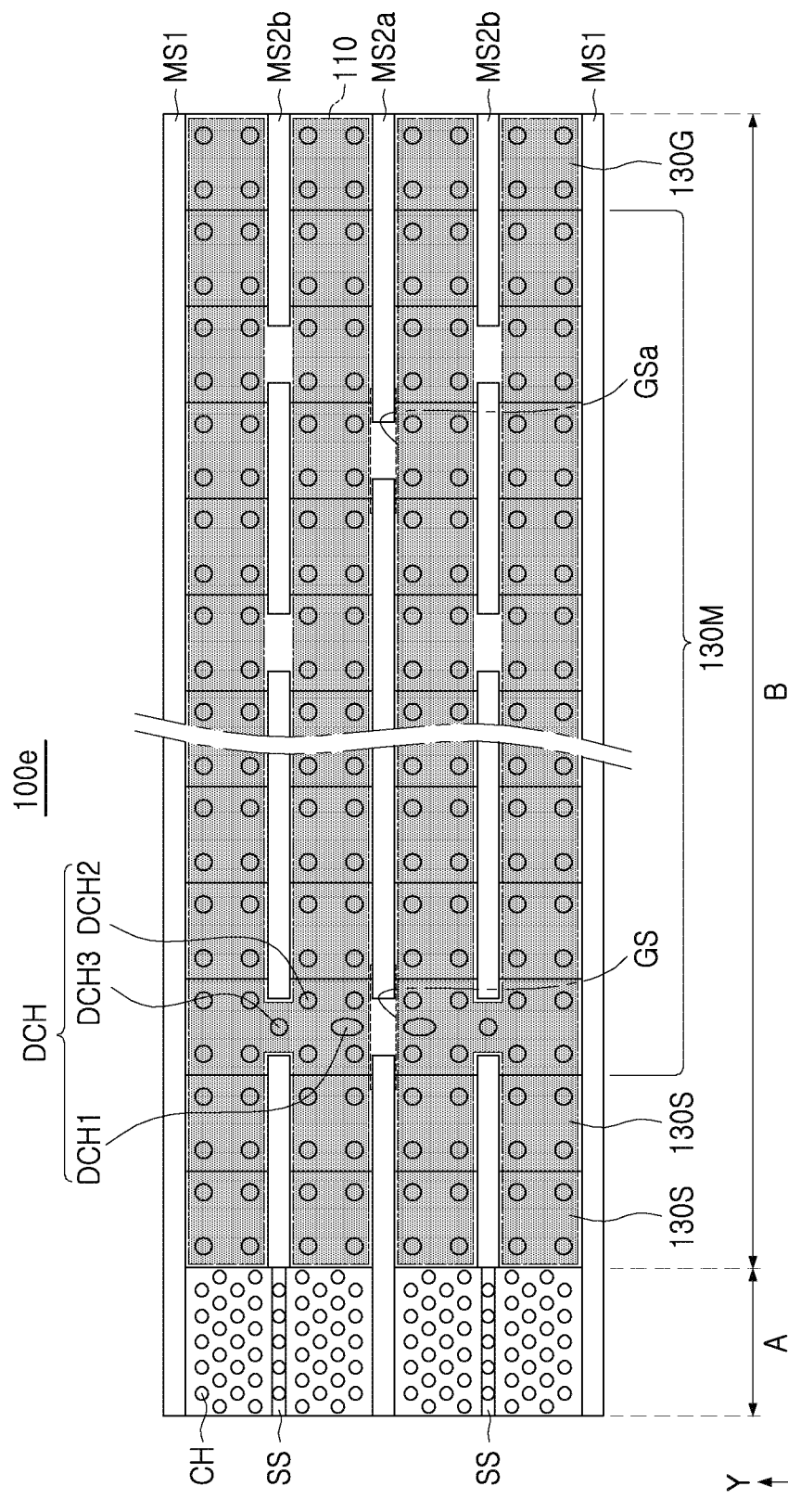
FIG. 8 is a plan diagram illustrating a semiconductor device according to an example embodiment of the present inventive concept.

FIG. 8 is a plan diagram illustrating a semiconductor device according to an example embodiment.

Referring to FIG. 8, in a semiconductor device 100e, on a right side of a lower separation region GS in FIG. 8, second central separation regions MS2a may not extend as a single region, and may be spaced apart from each other in at least one region in the x direction, and a plurality of the second central separation regions MS2a may be disposed, differently from the example embodiment in FIG. 3A. The above-described configuration may be to enhance a function of preventing collapse of a stack structure including interlayer insulating layers 120 during a manufacturing process, when the number of gate electrodes 130 of the semiconductor device 100e increases. Accordingly, to separate ground select gate electrode 130G, a lower separation region GSa may further be disposed in a region in which the second central separation regions MS2a are spaced apart from each other.

In the example embodiment, the first dummy channel structures DCH1 may be disposed on an external side of a spacing region between the second central separation regions MS2a in a higher region of the stack structure of the gate electrodes 130 (e.g., a region nearer the first region A), and may not be disposed on an external side of a spacing between the second central separation regions MS2a in a lower region of the stack structure (e.g., a region farther from the first region A). Accordingly, the first dummy channel structures DCH1 may only be disposed on both sides of the lower separation region GS adjacent to a first region A, and may not be disposed on both sides of the other lower separation region GSa. The above-described configuration may be based on an arrangement of contact plugs MCP, and the configuration will be described in greater detail with reference to FIGS. 10A and 10B later.

Figure 9:
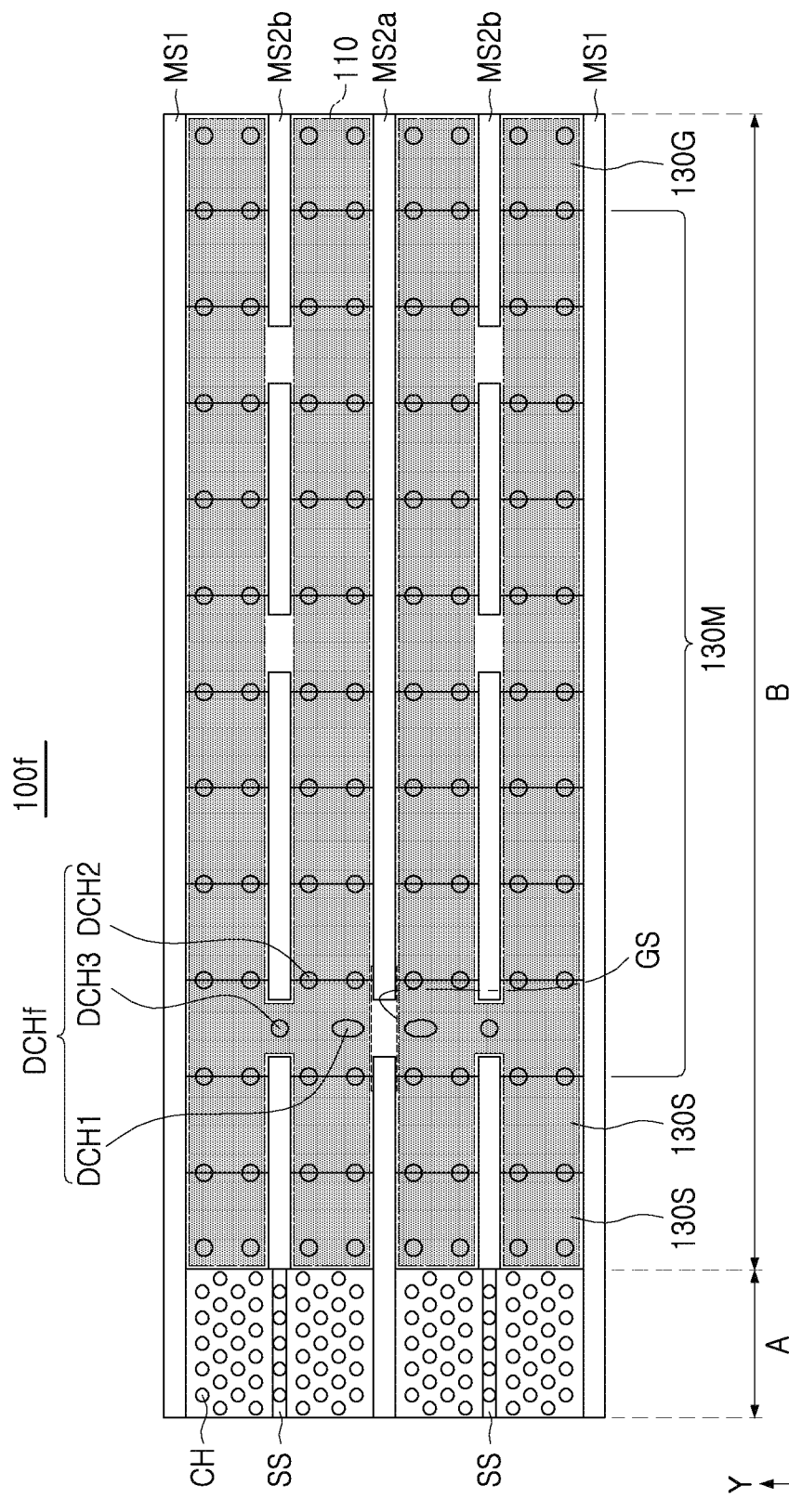
FIG. 9 is a plan diagram illustrating a semiconductor device according to an example embodiment of the present inventive concept.

FIG. 9 is a plan diagram illustrating a semiconductor device according to an example embodiment.

Referring to FIG. 9, in a semiconductor device 100f, an arrangement of second dummy channel structures DCH2 of dummy channel structures DCHf may be different from the example illustrated in FIG. 3A. The second dummy channel structures DCH2 may be disposed along ends of gate electrodes 130. For example, the second dummy channel structures DCH2 may disposed across the ends of the gate electrodes 130, bridging the ends of the gate electrodes 130. Accordingly, two second dummy channel structures DCH2 may be in a single unit pad region arithmetically, rather than disposing four second dummy channel structures DCH2 in a single unit pad region. For example, each second dummy channel structures DCH2 may be disposed such that a first half of the second dummy channel structure DCH2 is in a first pad region and a second half of the second dummy channel structure DCH2 is a second pad region. Even in this case, first dummy channel structures DCH1 may also be disposed on an external side of a lower separation region GS in the y direction. Accordingly, in example embodiments, each of the first dummy channel structures DCH1 may have an extended size in the x direction as compared to the example embodiment illustrated in FIG. 3A.

Figure 10A:
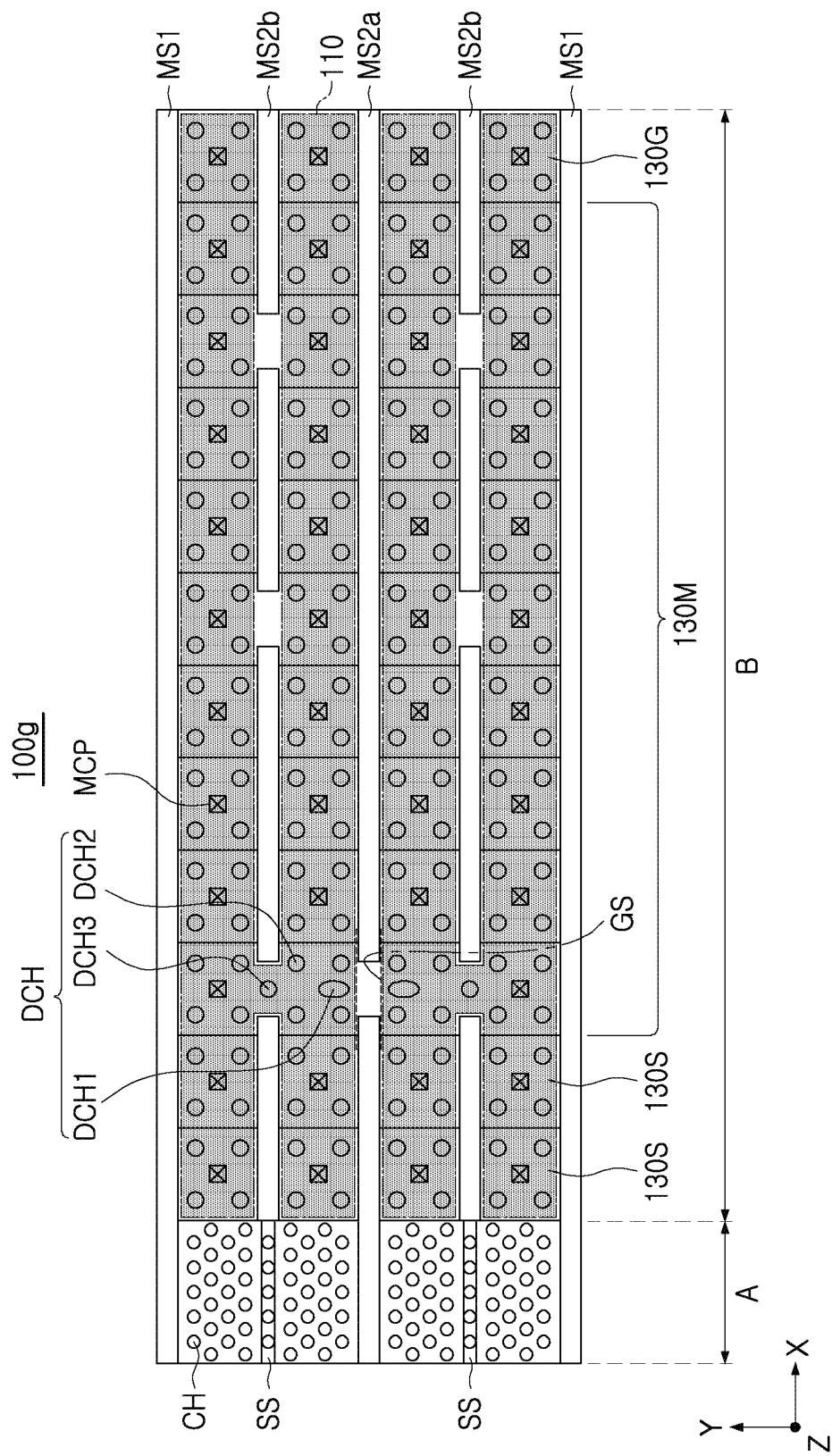
FIGS. 10A and 10B are plan diagram illustrating a semiconductor device according to an example embodiment of the present inventive concept.
Figure 10B:
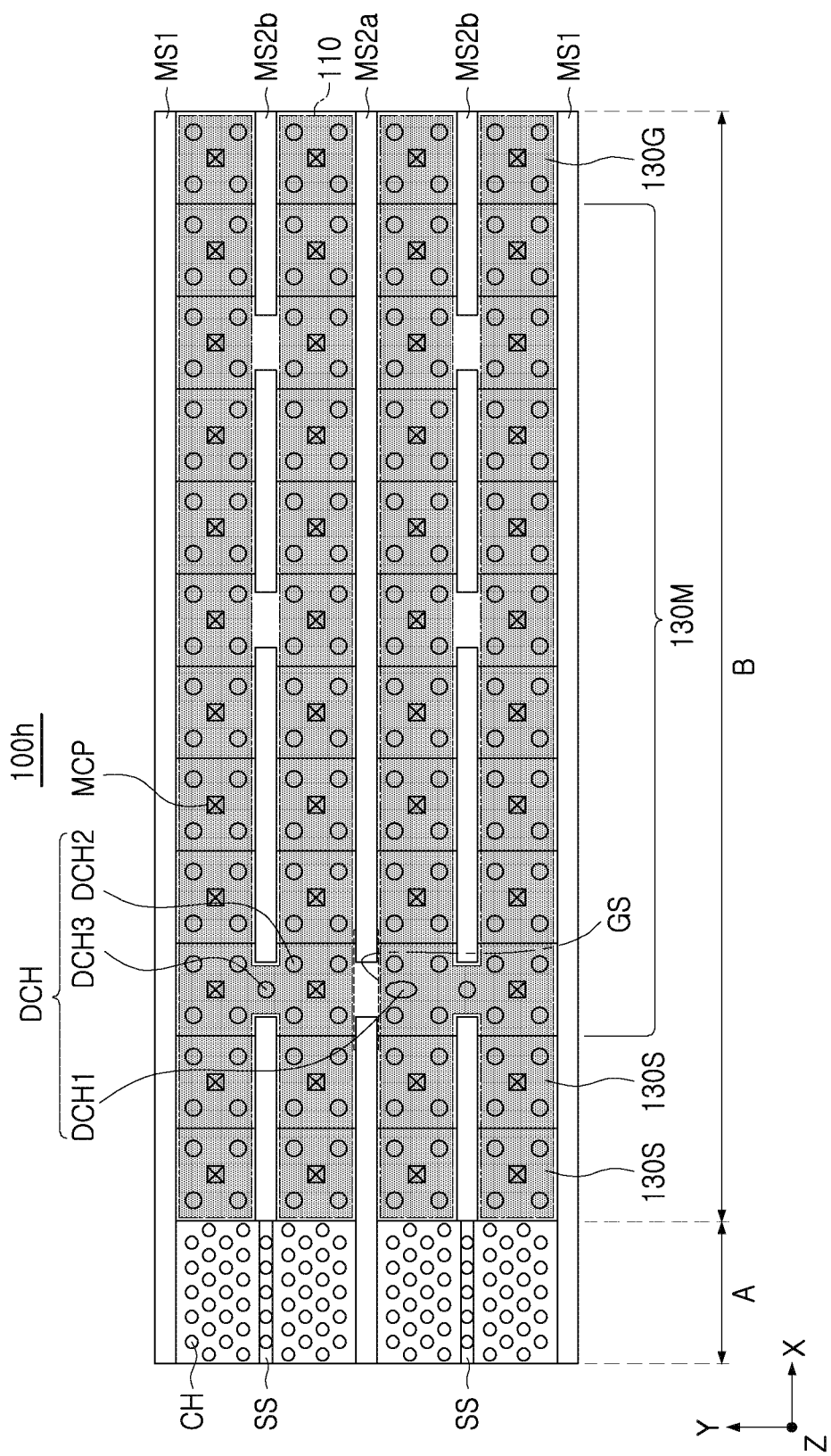

FIGS. 10A and 10B are plan diagram illustrating a semiconductor device according to an example embodiment.

Referring to FIG. 10A, a semiconductor device 100g may further include contact plugs MCP disposed in stepped portions of gate electrodes 130, e.g., pad regions. The contact plugs MCP may connect the gate electrodes 130 to a wiring structure disposed in an upper portion, and may be formed of a conductive material. As illustrated in FIG. 10A, the contact plugs MCP may not be provided in a pad region adjacent to a spacing region between second central separation regions MS2a, in the y direction, a region in which a lower separation region GS is disposed. For example, the contact plugs MCP may be disposed in a regular pattern, and the contact plugs MCP may not be provided in a memory gate electrode 130M disposed in an uppermost portion around the first dummy channel structures DCH1. Accordingly, a region in which the first dummy channel structures DCH1 are disposed may be secured. In this case, as the memory gate electrode 130M in the uppermost portion may form a single layer between a pair of first separation regions MS1, the memory gate electrode 130M may be electrically connected to the wiring structure through the contact plugs MCP disposed in the other pad region.

Referring to FIG. 10B, differently from the example embodiment illustrated in FIG. 10A, in a semiconductor device 100h, a contact plug MCP may be disposed in a unit pad region on one side among unit pad regions adjacent to a region in which the lower separation region GS is disposed, adjacent in the y direction, and the contact plug MCP may not be disposed in a unit pad region on the other side. Accordingly, the first dummy channel structures DCH1 may not be disposed in the unit pad region on the one side on which the contact plug MCP is disposed, and may only be disposed in the unit pad region on the other side on which the contact plug MCP is not disposed.

Figure 11:
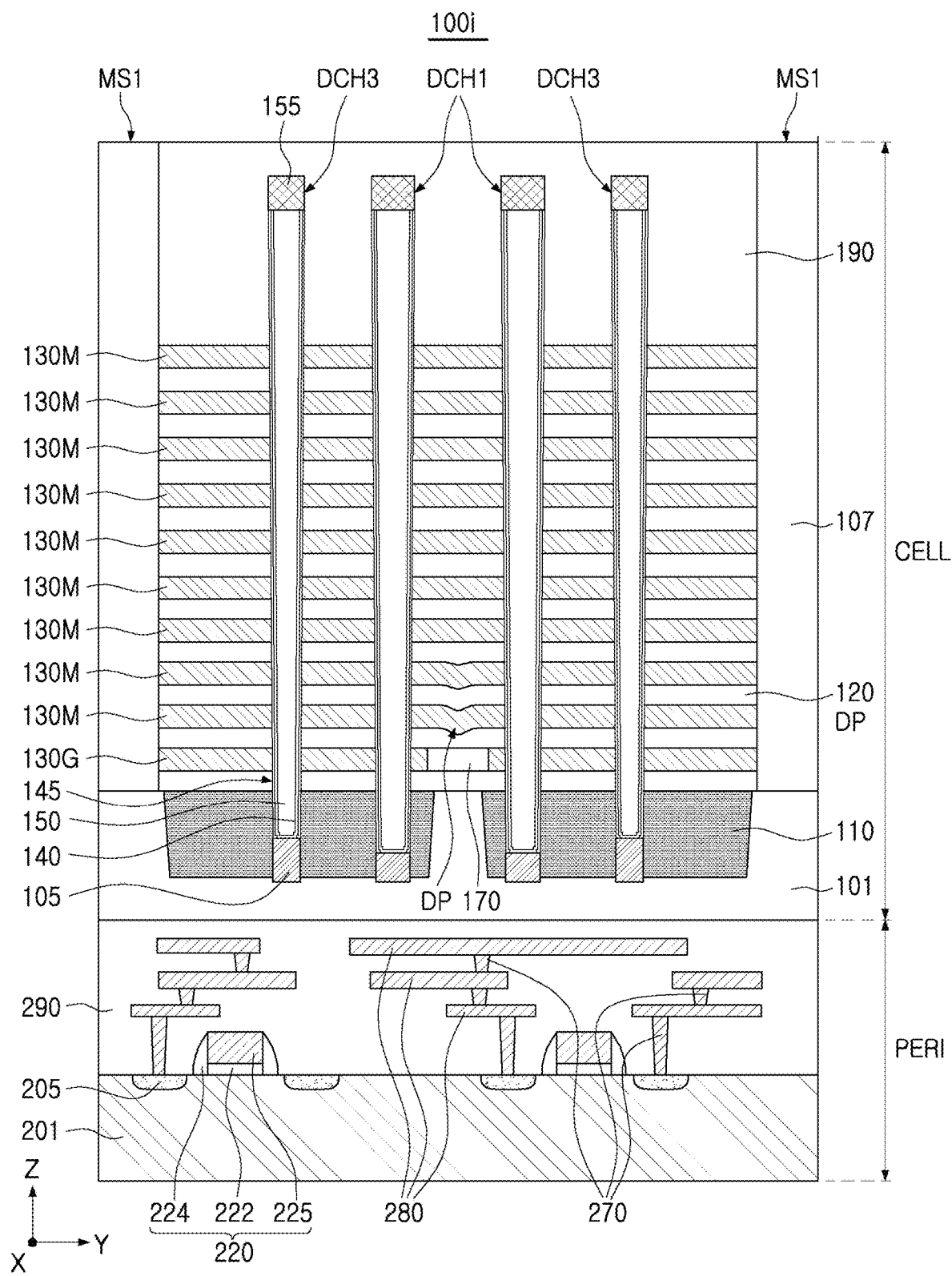
FIG. 11 is a cross-sectional diagram illustrating a semiconductor device according to an example embodiment of the present inventive concept.

FIG. 11 is a cross-sectional diagram illustrating a semiconductor device according to an example embodiment.

Referring to FIG. 11, a semiconductor device 100i may include a memory cell region CELL and a peripheral circuit region PERI. The memory cell region CELL may be disposed on an upper surface of the peripheral circuit region PERI. Alternatively, in example embodiments, the memory cell region CELL may be disposed on a lower surface of the peripheral circuit region PERI.

The memory cell region CELL may include a substrate 101, a substrate insulating layer 110, gate electrodes 130, channel structures CH and dummy channel structures DCH, first and second separation regions MS1, MS2a, and MS2b, and a lower separation region GS as in the example embodiments illustrated in FIGS. 3A to 4C. The memory cell region CELL may also have one or more of the structures described in the aforementioned example embodiments with reference to FIGS. 5A to 10B.

The peripheral circuit region PERI may include a base substrate 201, circuit devices 220 disposed on the base substrate 201, circuit contact plugs 270, and wiring lines 280.

The base substrate 201 may have an upper surface extending in the x direction and the y direction. The base substrate 201 may include device isolation layers, and an active region may be defined in the base substrate 201. Source/drain regions 205 including impurities may be disposed in a portion of the active region. The base substrate 201 may include a semiconductor material, such as an IV group semiconductor, a III-V group compound semiconductor, or a II-VI group compound semiconductor, for example.

The circuit devices 220 may include planar transistors. Each of the circuit devices 220 may include a circuit gate insulating layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate the peripheral region insulating layer 290 and may be connected to the source/drain regions 205. An electrical signal may be applied to the circuit devices 220 by the circuit contact plugs 270. In a region not illustrated, the circuit contact plugs 270 may also be connected to the circuit gate electrodes 225. The wiring lines 280 may be connected to the circuit contact plugs 270, and may be configured as a plurality of layers. The gate electrodes 130 of the memory cell region CELL may be connected to the circuit devices 220 of the peripheral circuit region PERI through a penetration region penetrating through the peripheral circuit region PERI and a penetration via formed in the penetration region.

In the semiconductor device 100i, the peripheral circuit region PERI may be manufactured, and the substrate 101 of the memory cell region CELL may be formed on an upper portion of the peripheral circuit region PERI, thereby manufacturing the memory cell region CELL. The substrate 101 may have a size the same as or smaller than a size of the base substrate 201.

FIGS. 12A to 16B are plan diagrams and cross-sectional diagrams illustrating a method of manufacturing a semiconductor device according to an example embodiment. The cross-sectional diagrams in FIGS. 12A to 16B illustrate a region corresponding to the region illustrated in FIG. 4A.

Figure 12A:
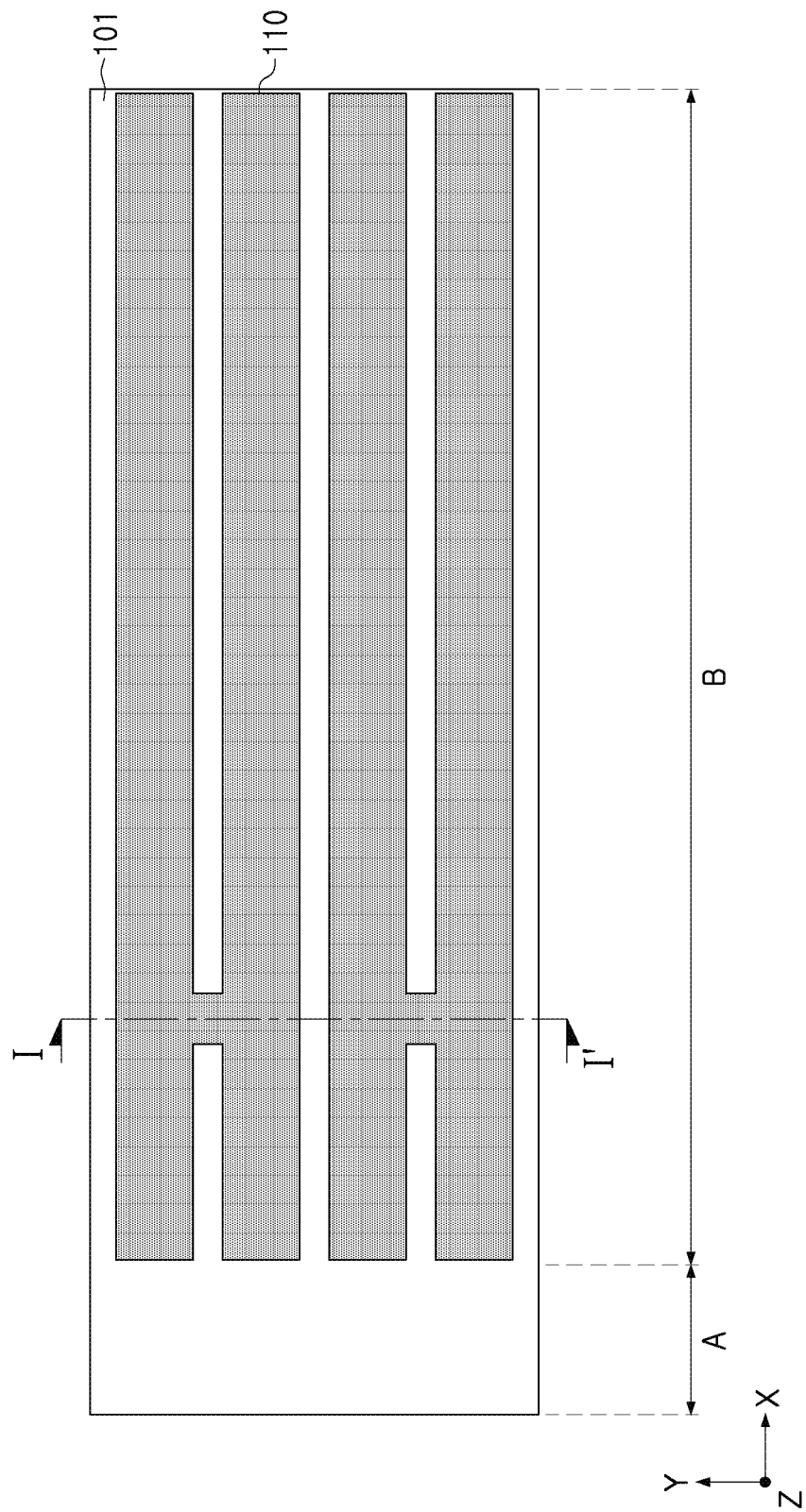
FIGS. 12A to 16B are plan diagrams and cross-sectional diagrams illustrating a method of manufacturing a semiconductor device according to an example embodiment of the present inventive concept.
Figure 12B:
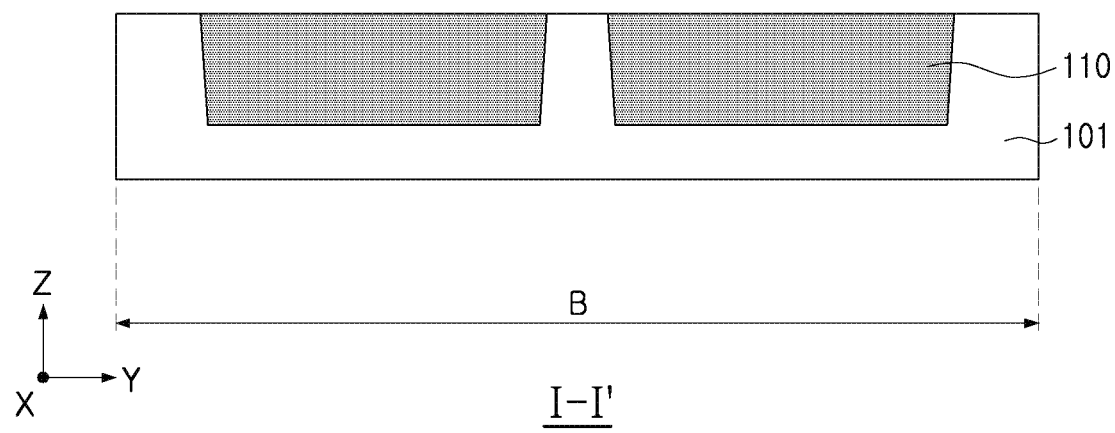

Referring to FIGS. 12A and 12B, a substrate insulating layer 110 may be formed in a substrate 101 in a second region B.

Trench regions may be formed by anisotropic-etching of a portion of the substrate 101. A width of each of the trench regions may decrease downwardly. For example, a width of each trench region may be narrower nearer a lower surface of the substrate 101 and wider nearer an upper surface of the substrate 101. The trench regions may be filled with an insulating material, and a process of planarizing the trench regions along an upper surface of the substrate 101 may be performed to form the substrate insulating layer 110. By the planarization process, upper surfaces of the substrate insulating layer 110 may be coplanar with an upper surface of the substrate 101.

The substrate insulating layer 110 may be disposed in the second region B of the substrate 101, other than a region in which first and second separation regions MS1, MS2a, and MS2b are disposed. In example embodiments, when a device isolation layer which defines an active region of the substrate 101 is formed in a region not illustrated in the diagram, the substrate insulating layer 110 may be formed together with the device isolation layer in the same process.

Figure 13A:
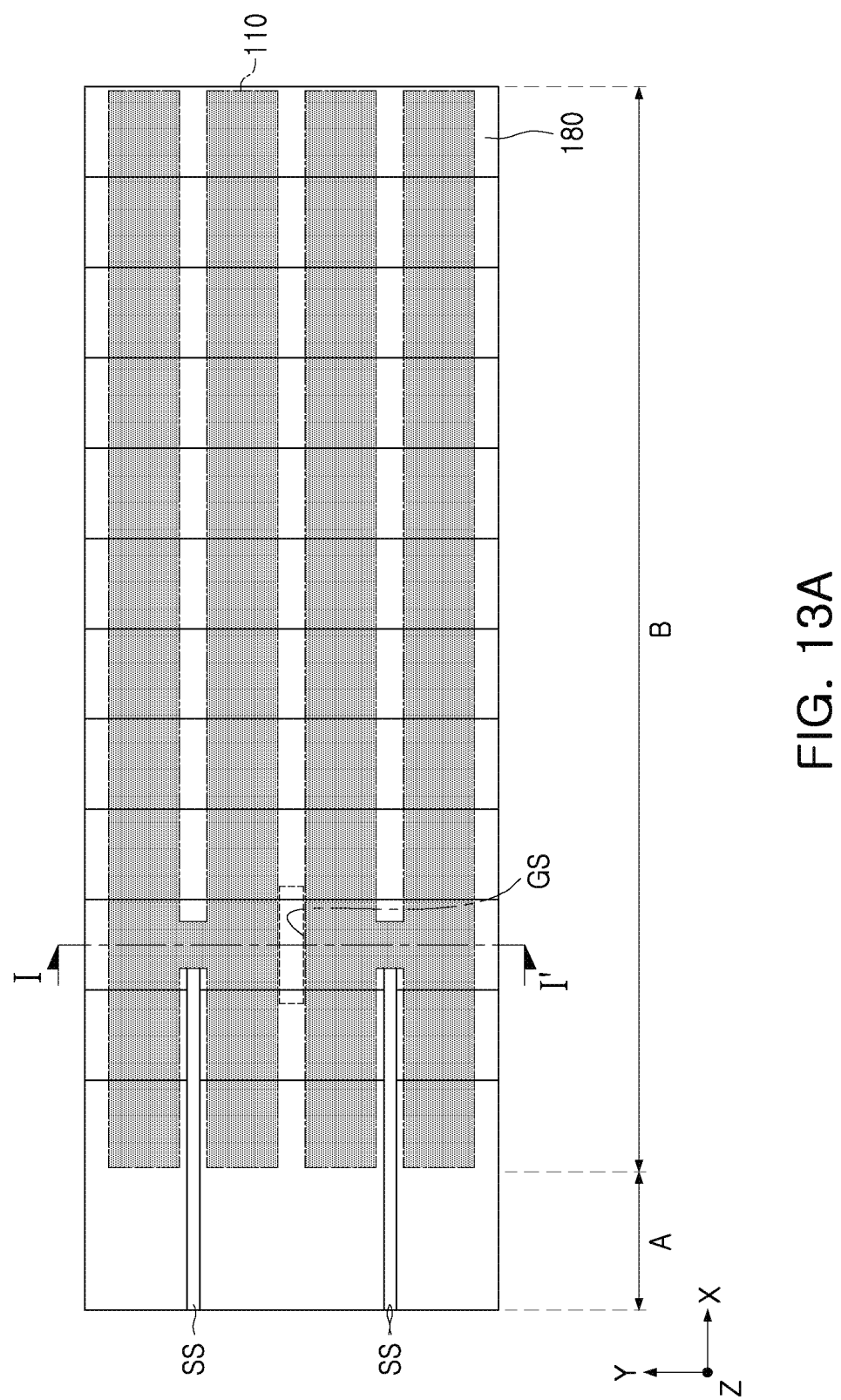
Figure 13B:
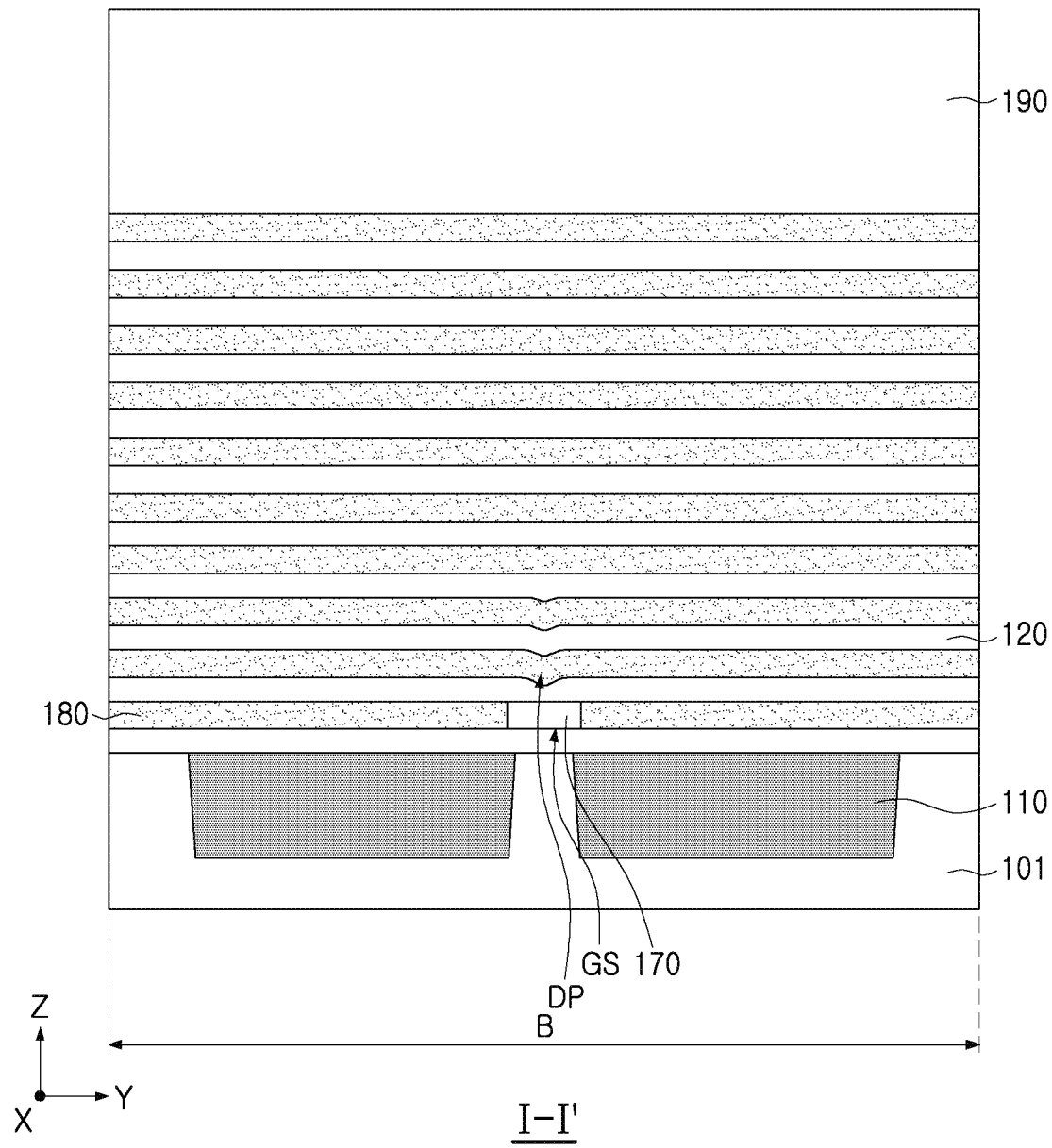

Referring to FIGS. 13A and 13B, sacrificial layers 180 and interlayer insulating layers 120 may be alternately stacked on the substrate 101, portions of the sacrificial layers 180 and the interlayer insulating layers 120 may be removed such that the sacrificial layers 180 may extend in the x direction by different lengths, and a lower separation region GS and upper separation regions SS may be formed.

The sacrificial layers 180 may be replaced with the gate electrodes 130 in a subsequent process. The sacrificial layers 180 may be formed of a material having etching selectivity with respect to the interlayer insulating layers 120. For example, the interlayer insulating layers 120 may be formed of at least one of silicon oxide and silicon nitride, and the sacrificial layers 180 may be formed of a material different from the material of the interlayer insulating layers 120, selected from among silicon, silicon oxide, silicon carbide, and silicon nitride. In example embodiments, thicknesses of the interlayer insulating layers 120 may not be uniform. For example, a lowermost interlayer insulating layer 120 may have a relatively thin thickness, and an uppermost interlayer insulating layer 120 may have a relatively thick thickness. Thicknesses of the sacrificial layers 180 and the interlayer insulating layers 120 and the number of layers of sacrificial layers 180 and of the interlayer insulating layers 120 may be varied.

In the second region B, a photolithography process and an etching process may be repeatedly performed on the sacrificial layers 180 to allow the sacrificial layers 180 disposed in an upper portion to extend less than the sacrificial layers 180 disposed in a lower portion. Accordingly, the sacrificial layers 180 may have a staircase form. In example embodiments, a material for forming the sacrificial layers 180 may further be deposited in a region in which the sacrificial layers 180 disposed in a lower portion may be exposed by extending further than the sacrificial layers 180 disposed in an upper region, such that an end of each of the sacrificial layers 180 may have an increased thickness.

After the lowermost sacrificial layer 180 is formed, a patterning process and a process of depositing an insulating material may be performed such that the lower separation region GS may include a lower insulating layer 170. The lower insulating layer 170 may be formed of a material having etching selectivity with respect to the sacrificial layers 180. In example embodiments, the lower separation region GS may be formed of a material of the interlayer insulating layers 120 by removing the sacrificial layers 180 from the lower separation region GS and forming the interlayer insulating layers 120 on an upper portion thereof. In a case in which a planarization process is not performed on the interlayer insulating layers 120, the interlayer insulating layers 120 in the upper portion may have a recess portion DP as illustrated in FIG. 13B. When a planarization process is performed on the interlayer insulating layers 120 in the upper portion, the recess portion DP may not be formed.

The upper separation region SS may extend lengthwise in the x direction, and may extend to a portion of the second region B from the first region A. A region in which the upper separation region SS is formed may be exposed using a mask layer, and a certain number of the sacrificial layers 180 and the interlayer insulating layers 120 may be removed from an uppermost portion. The upper separation region SS may extend more downwardly than a region in which string select gate electrodes 130S are disposed as in FIG. 4B. An insulating material may be deposited in a region from which the sacrificial layers 180 and the interlayer insulating layers 120 are removed, and an upper insulating layer 103 may be formed. The upper insulating layer 103 may be formed of a material having etching selectivity with respect to the sacrificial layers 180, and may be formed of a material the same as the material of the interlayer insulating layers 120, for example.

A cell region insulating layer 190 covering an upper portion of a stack structure of the sacrificial layers 180 and the interlayer insulating layers 120 may be formed.

Figure 14A:
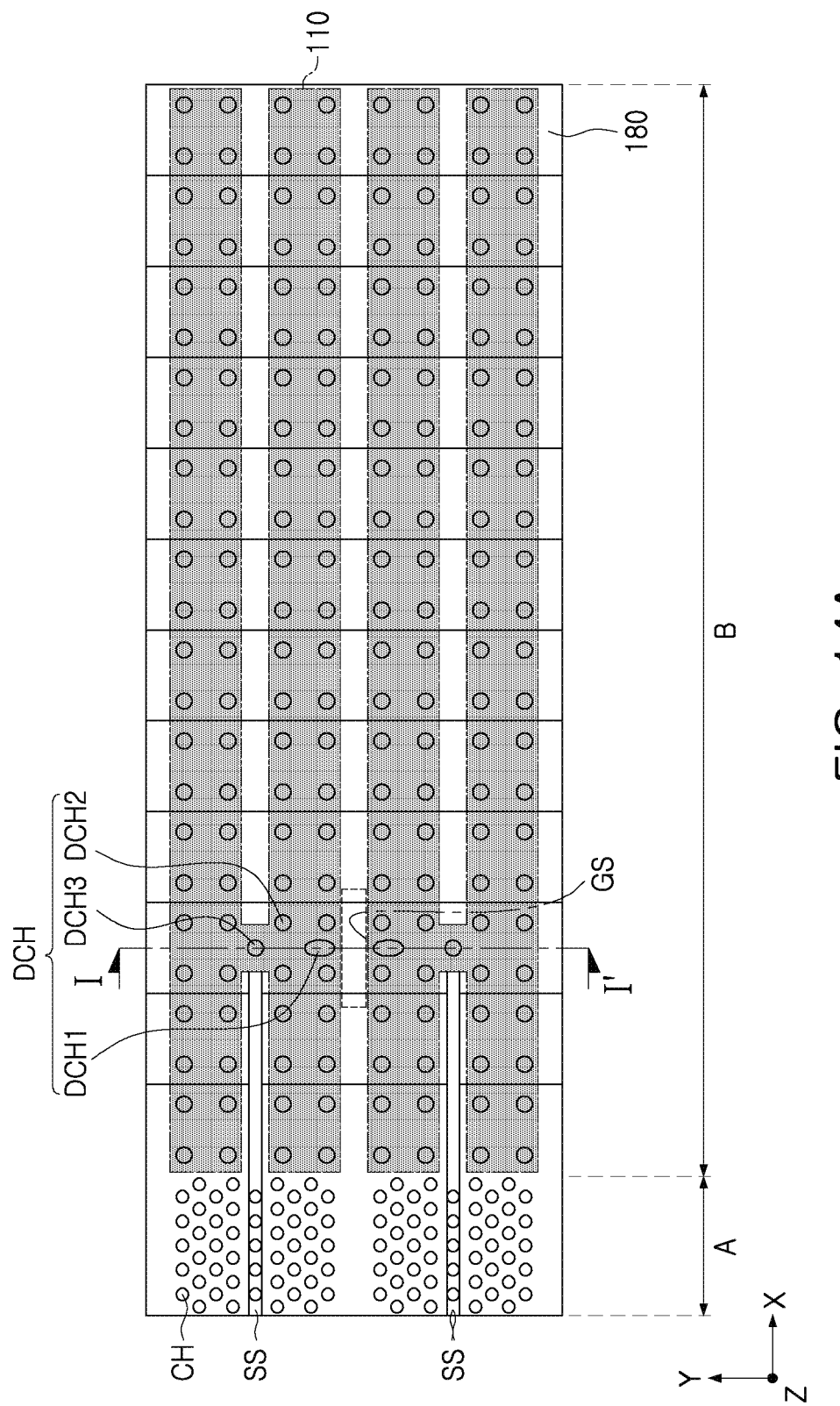
Figure 14B:
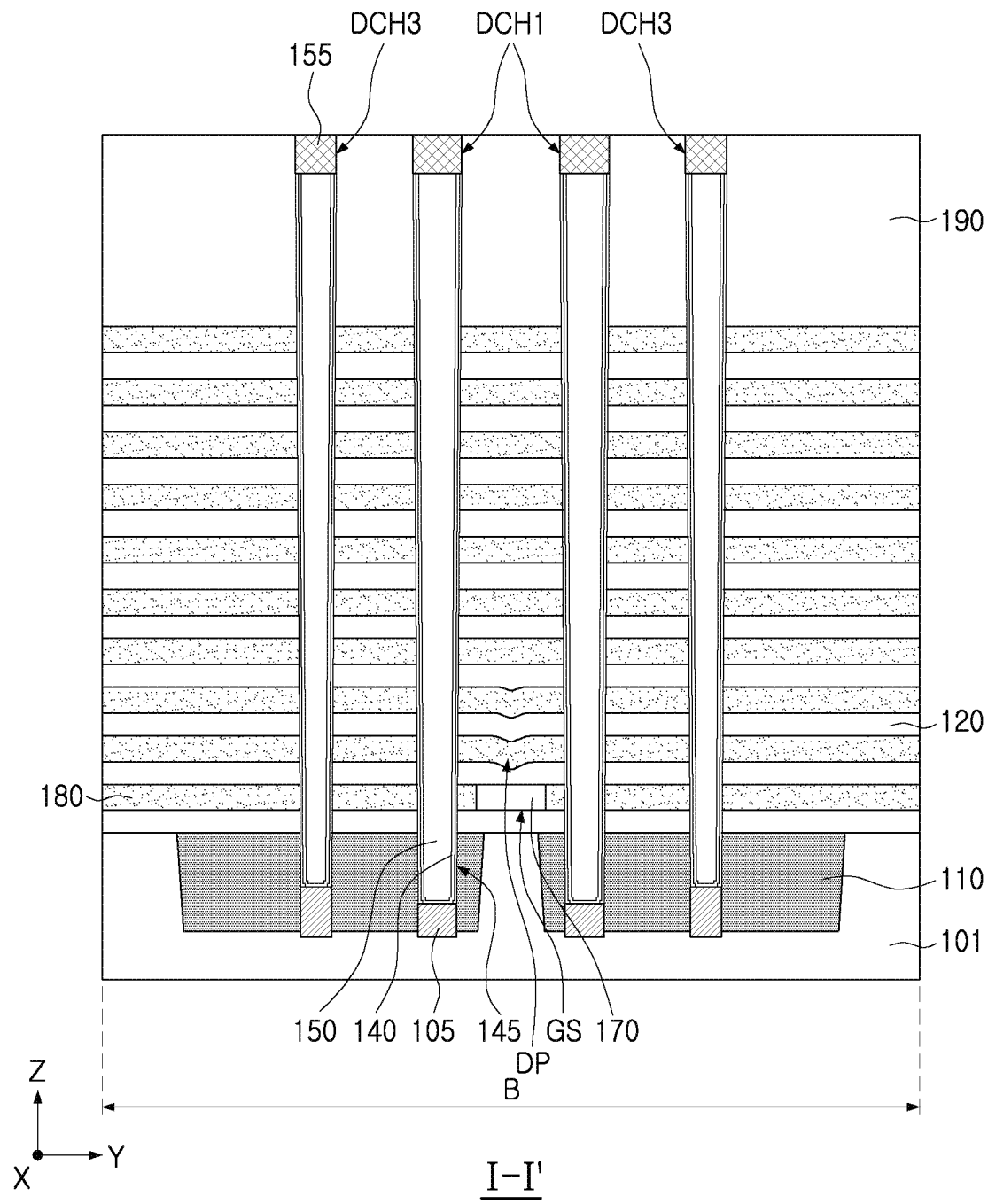

Referring FIGS. 14A and 14B, channel structures CH and dummy channel structures DCH penetrating through a stack structure of the sacrificial layers 180 and the interlayer insulating layers 120 may be formed.

The channel structures CH and the dummy channel structures DCH may be formed by anisotropic-etching of the sacrificial layers 180 and the interlayer insulating layers 120, and may be formed as a hole-type. Due to a height of the stack structure, side walls of the channel structures CH and the dummy channel structures DCH may not be perpendicular to an upper surface of the substrate 101. The channel structures CH may be formed in the first region A of the substrate 101, and the dummy channel structures DCH may be formed in the second region B. The dummy channel structures DCH may be configured to penetrate at least a portion of the substrate insulating layer 110. In example embodiments, the channel structures CH and the dummy channel structures DCH may be configured to recess a portion of the substrate 101. Alternatively, in example embodiments, the dummy channel structures DCH may not completely penetrate the substrate insulating layer 110 and may only extend into the substrate insulating layer 110 such that the dummy channel structures DCH may not be in contact with the substrate 101.

An epitaxial layer 105, at least a portion of a gate dielectric layer 145, a channel layer 140, a channel insulating layer 150, and channel pads 155 may be formed in the channel structures CH and the dummy channel structures DCH. When other dummy channel structures (not illustrated) are further disposed in the first region A along with the channel structures CH in addition to the dummy channel structures DCH, the dummy channel structures may be formed together with the channel structures CH in the present stage.

The epitaxial layer 105 may be formed using a selective epitaxial growth (SEG) process. The epitaxial layer 105 may be provided as a single epitaxial layer or multi-epitaxial layers. The epitaxial layer 105 may include polycrystalline silicon, single crystalline silicon, polycrystalline germanium, or single crystalline germanium, in which impurities may be doped or undoped. In the dummy channel structures DCH, an upper end of the epitaxial layer 105 may be disposed in the substrate insulating layer 110, and at least a portion of a side surface of the epitaxial layer 105 may be surrounded by the substrate insulating layer 110. Accordingly, the epitaxial layer 105 may be spaced apart from the sacrificial layers 180 in the dummy channel structures DCH.

The gate dielectric layer 145 may be configured to have a uniform thickness through atomic layer deposition (ALD) or chemical vapor deposition (CVD). In this process, an entire portion of the gate dielectric layer 145 may be formed, or the gate dielectric layer 145 may be partially formed, and a portion of the gate dielectric layer 145 extending perpendicularly to the substrate 101 along with the channel structures CH and the dummy channel structures DCH may be formed in this process. The channel layer 140 may be formed on the gate dielectric layer 145 in the channel structures CH and the dummy channel structures DCH. The channel insulating layer 150 may fill the channel structures CH and the dummy channel structures DCH, and may be formed of an insulating material. In example embodiments, an inner region of the channel layer 140 may be filled with a conductive material, rather than the channel insulating layer 150. The channel pads 155 may be formed of a conductive material, such as polycrystalline silicon, for example.

Figure 15A:
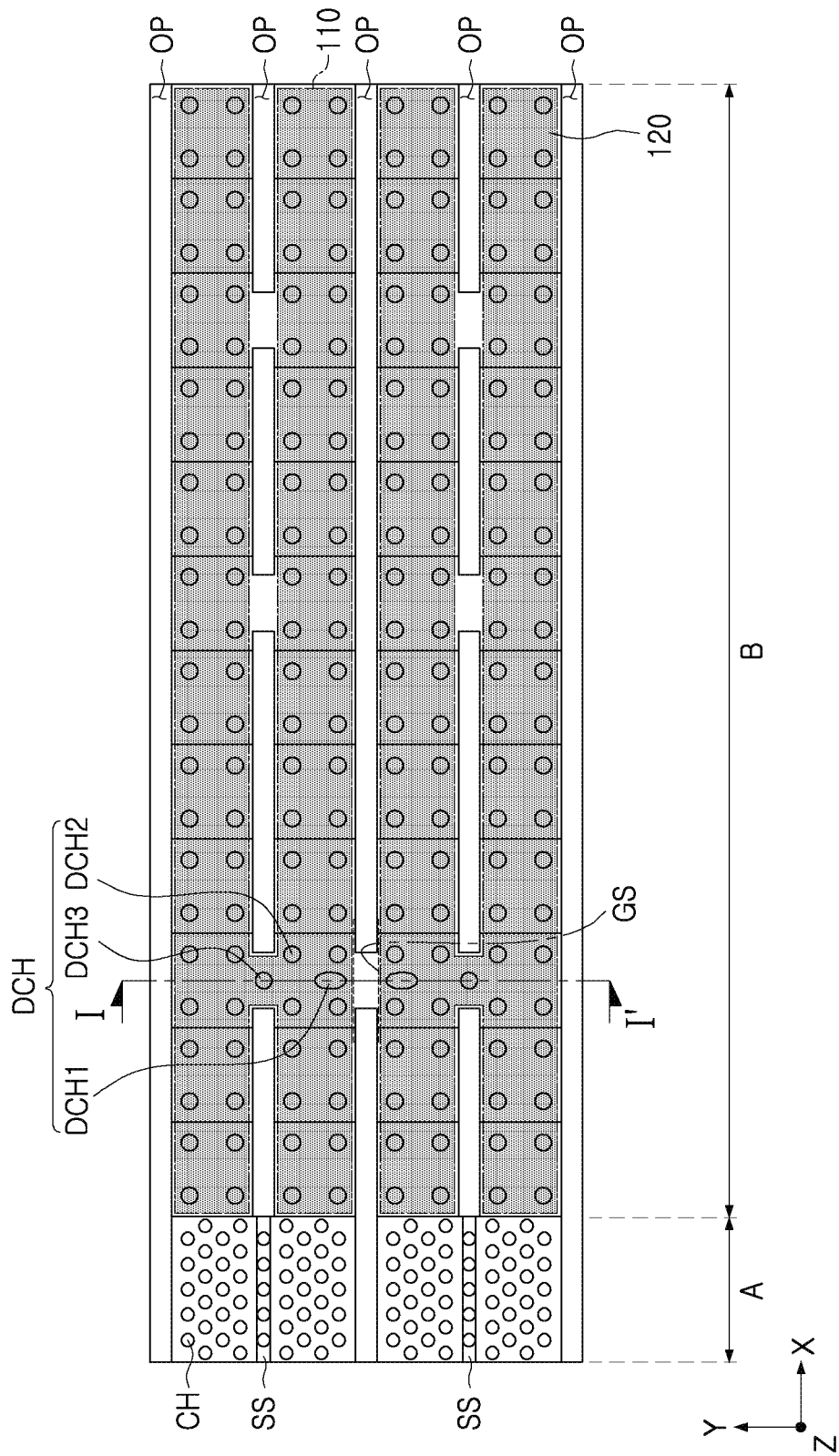
Figure 15B:
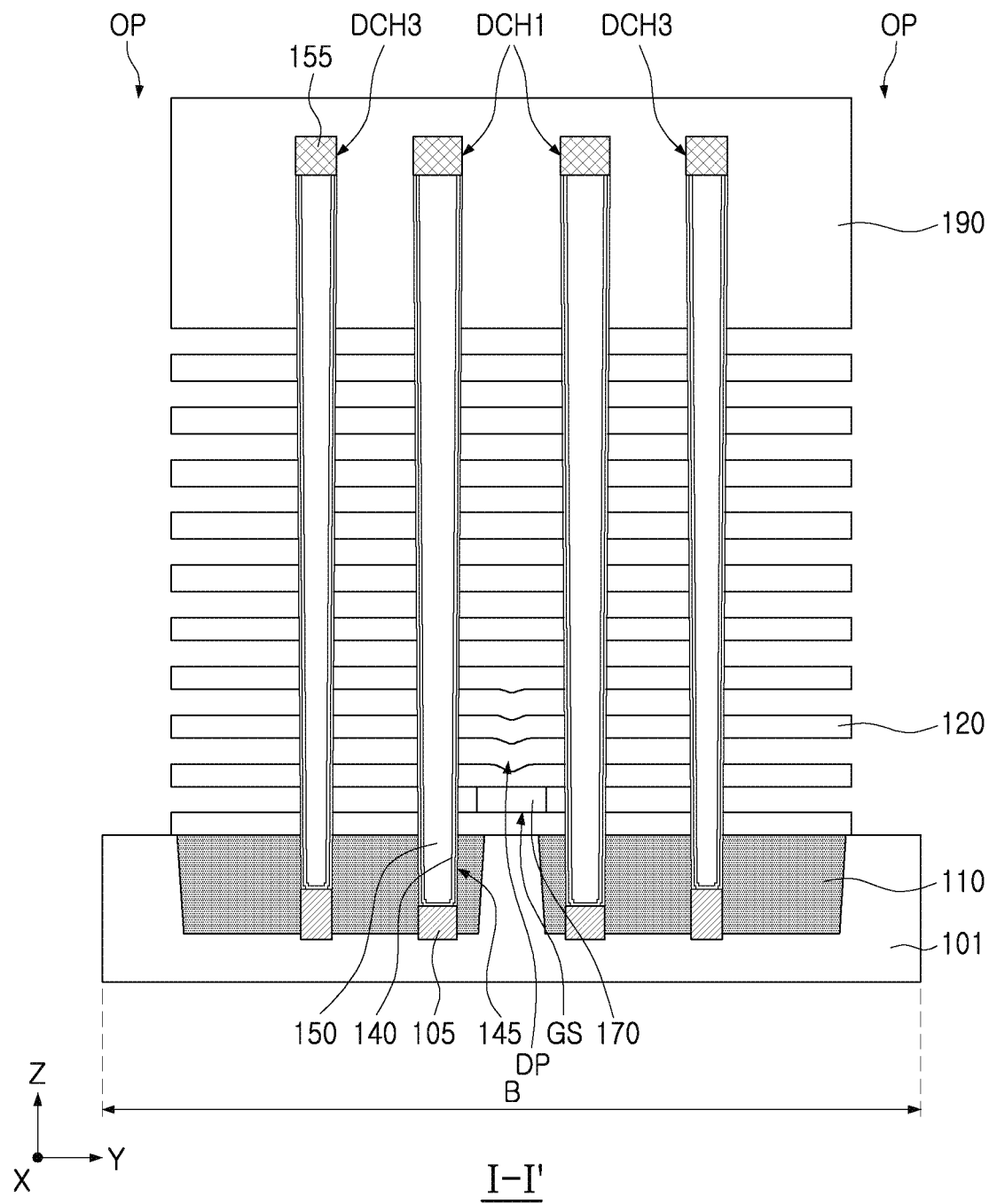

Referring to FIGS. 15A and 15B, openings OP penetrating through the stack structure of the sacrificial layers 180 and the interlayer insulating layers 120 may be formed, and the sacrificial layers 180 may be removed through the openings OP.

The openings OP may be formed by forming a mask layer using a photolithography process and anisotropic-etching the stack structure. Before forming the openings OP, a cell region insulating layer 190 may be additionally formed on the channel structures CH and the dummy channel structures DCH to protect the lower structures. The openings OP may be formed as trenches at positions corresponding to the first and second separation regions MS1, MS2a, and MS2b. Accordingly, the openings OP may extend lengthwise in the x direction. Portions of the openings OP may extend along entire regions of the first and second regions A and B, and other portions may only extend in the second region B. In this process, the substrate 101 may be exposed in a lower portion of the openings OP.

The sacrificial layers 180 may be selectively removed with respect to the interlayer insulating layers 120 using a wet etching process, for example. Accordingly, lateral openings may be formed between the interlayer insulating layers 120, and portions of side walls of the gate dielectric layer 145 of the channel structures CH and side surfaces of the lower insulating layer 170 may be exposed through the lateral openings. In this process, stability of the stack structure of the interlayer insulating layers 120 may degrade after the sacrificial layers 180 are removed, but the stack structure may be stably supported by the regions in which the openings OP are spaced apart from each other and the dummy channel structures DCH. Also, each of first dummy channel structures DCH1 disposed on an external side of the lower separation region GS may have a relatively great size such that the stack structure of the interlayer insulating layers 120 may further be supported.

Figure 16A:
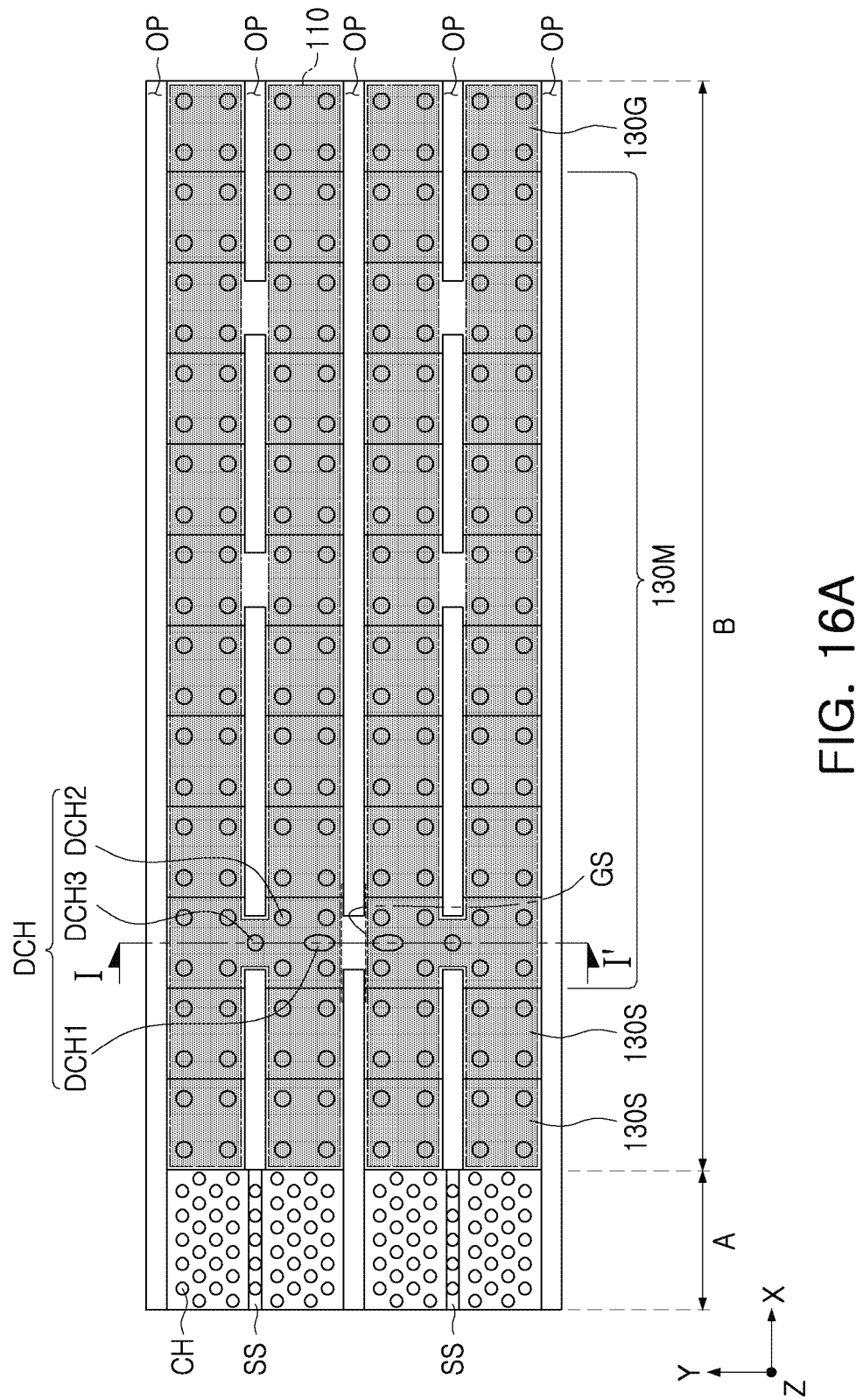
Figure 16B:
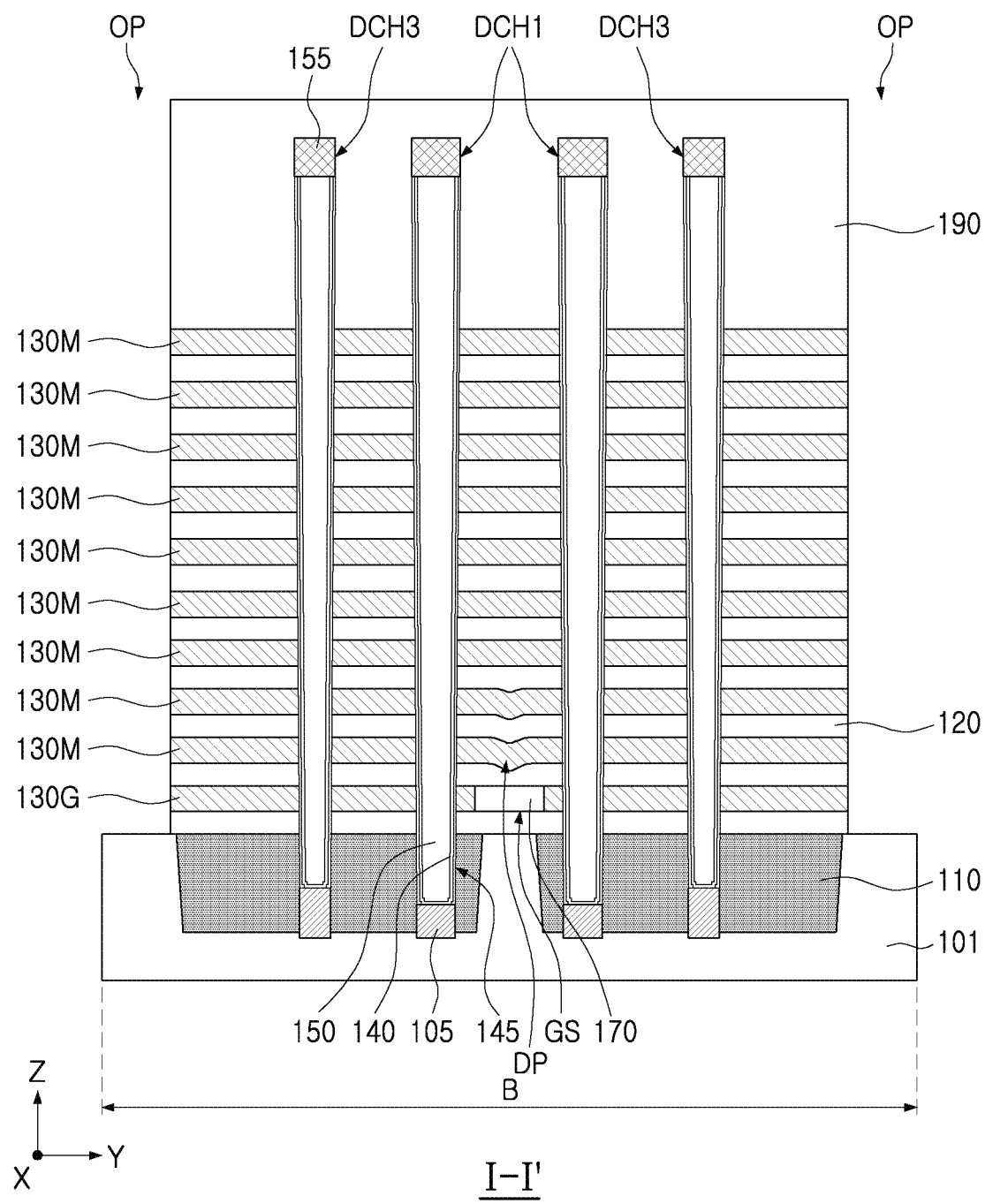

Referring to FIGS. 16A and 16B, the gate electrodes 130 may be formed by filling a region from which the sacrificial layers 180 are removed with a conductive material.

The gate electrodes 130 may include a metal, polycrystalline silicon, or a metal silicide material. The openings OP may provide a transfer pass of a material for forming the gate electrodes 130. The gate electrodes 130 may not be separated from each other and may be connected to each other between the openings OP linearly spaced apart from each other in the x direction such that gate connectors may be formed. After forming the gate electrodes 130, a material for forming the gate electrodes 130, deposited in the openings OP, may be removed by an additional process.

Referring back to FIGS. 3A and 4A, a separation layer 107 may be formed in the openings OP.

The separation layer 107 may include an insulating material, and in example embodiments, the separation layer 107 may further include a conductive material along with an insulating material. Accordingly, the first and second separation regions MS1, MS2a, and MS2b may be formed, and the first and second separation regions MS1, MS2a, and MS2b may be formed in the same process and may have the same structure.

Upper wiring structures such as contact plugs and bit lines may be formed on the channel structures CH.

According to the aforementioned example embodiments, by optimizing an arrangement of dummy channel structures in consideration of an arrangement of the substrate insulating layer and the lower separation region, a semiconductor device having improved reliability may be provided.

While the example embodiments have been shown and described above, it will be apparent to those skilled in the art that modifications and variations could be made without departing from the scope of the present inventive concept as defined by the appended claims.

What is claimed is:

1. A semiconductor device, comprising:
a substrate having first and second regions;
a stack structure including gate electrodes spaced apart from each other and stacked in a first direction perpendicular to an upper surface of the substrate in the first region, and the gate electrodes extending in a second direction perpendicular to the first direction by different lengths and providing pad regions in the second region;
separation regions penetrating through the stack structure and extending in the second direction in the first and second regions, and spaced apart from each other in the second direction in the second region;
a lower separation region penetrating through at least one gate electrode including a lowermost gate electrode among the gate electrodes between the separation regions adjacent to each other in the second direction and separating the at least one gate electrode along with the separation regions;
channel structures penetrating through the stack structure and extending perpendicularly to the substrate in the first region; and
dummy channel structures penetrating through the stack structure and extending perpendicularly to the substrate in the second region,
wherein the stack structure includes an upper pad region and a lower pad region that is on a level lower than a level of the upper pad region, and
wherein a number of the dummy channel structures penetrating through the upper pad region is different from a number of the dummy channel structures penetrating through the lower pad region.

2. The semiconductor device of claim 1, further comprising:
a substrate insulating layer disposed in the substrate between the separation regions in the second region,
wherein the dummy channel structures further penetrate through the substrate insulating layer.

3. A semiconductor device, comprising:
a substrate having first and second regions;
a stack structure including gate electrodes spaced apart from each other and stacked in a first direction perpendicular to an upper surface of the substrate in the first region, and the gate electrodes extending in a second direction perpendicular to the first direction by different lengths and providing pad regions in the second region;
separation regions penetrating through the stack structure and extending in the second direction in the first and second regions, and spaced apart from each other in the second direction in the second region;
channel structures penetrating through the stack structure and extending perpendicularly to the substrate in the first region; and
dummy channel structures penetrating through the stack structure and extending perpendicularly to the substrate in the second region,
wherein the stack structure includes an upper pad region and a lower pad region, and each of the upper pad region and the lower pad region includes a region between the separation regions that are adjacent to each other in the second direction,
wherein a number of the dummy channel structures penetrating through the upper pad region is different from a number of the dummy channel structures penetrating through the lower pad region,
wherein a first gate electrode among the gate electrodes is exposed upwardly in the upper pad region, and
wherein a second gate electrode among the gate electrodes is exposed upwardly in the lower pad region.

4. The semiconductor device of claim 3, wherein the first dummy channel structure is disposed between the second dummy channel structures adjacent to each other in the second direction.

5. The semiconductor device of claim 3, wherein the upper pad region is disposed in a first level and the lower pad region is disposed in a second level lower than the first level.

6. The semiconductor device of claim 3, wherein the dummy channel structures include:
a first dummy channel structure penetrating through the upper pad region; and
second dummy channel structures penetrating through the upper pad region and the lower pad region and disposed in a regular pattern in the pad regions of the gate electrodes.

7. The semiconductor device of claim 6, wherein the first dummy channel structure penetrates the region between the separation regions.

8. A semiconductor device, comprising:
a substrate having first and second regions;
gate electrodes spaced apart from each other and stacked in a first direction perpendicular to an upper surface of the substrate on the first region, extending in a second direction perpendicular to the first direction by different lengths on the second region, and including at least one ground select gate electrode, memory cell gate electrodes, and at least one string select gate electrode stacked in order from the substrate;
first separation regions penetrating through the gate electrodes and extending in the second direction in the first and second regions, and spaced apart from each other in a third direction perpendicular to the first and second directions;
second separation regions penetrating through the gate electrodes and extending in the second direction between the first separation regions, and spaced apart from each other in the second direction in the second region;
third separation regions penetrating through the gate electrodes and extending in the second direction between the first separation regions and the second separation regions, and spaced apart from each other in the second direction with spacing regions therebetween in the second region;
a substrate insulating layer disposed in the substrate between the first separation regions and the second separation regions in the second region;
channel structures penetrating through the gate electrodes and extending perpendicularly to the substrate in the first region; and
dummy channel structures penetrating through the gate electrodes and the substrate insulating layer and extending perpendicularly in the second region,
wherein a stack structure of the gate electrodes includes an upper region and a lower region disposed between a pair of the first separation regions and respectively including the spacing regions, and wherein a number of the dummy channel structures penetrating through the upper region is greater than a number of the dummy channel structures penetrating through the lower region.

9. The semiconductor device of claim 8,
wherein the substrate insulating layer is disposed in the substrate below the spacing regions of the upper region, and
wherein the dummy channel structures include third dummy channel structures penetrating through the spacing regions.

10. The semiconductor device of claim 8, wherein a number of the gate electrodes stacked in the upper region is greater than a number of the dummy channel structures stacked in the lower region.

11. The semiconductor device of claim 8, wherein the upper region and the lower region are sequentially disposed from the first region in the second direction.

12. The semiconductor device of claim 8, further comprising:
a lower separation region penetrating through the at least one ground select gate electrode between the second separation regions and separating the at least one ground select gate electrode along with the second separation regions.

13. The semiconductor device of claim 12, wherein the substrate insulating layer is disposed between the lower separation region and the first separation regions and between the second separation regions and the first separation regions not to overlap the lower separation region on a plane.

14. The semiconductor device of claim 12, wherein the dummy channel structures include:
a first dummy channel structure penetrating through the upper region and disposed on an external side of the lower separation region in the third direction.

15. The semiconductor device of claim 8, wherein the dummy channel structures include:
a first dummy channel structure penetrating through the upper region; and
second dummy channel structures penetrating through the upper region and the lower region and forming columns and rows in the second region.

16. The semiconductor device of claim 15, wherein the first dummy channel structure is disposed between the second dummy channel structures adjacent to each other in the second direction.

17. The semiconductor device of claim 15, wherein each of the second dummy channel structures has a size and a shape different from a size and a shape of the first dummy channel structure.

18. The semiconductor device of claim 15, wherein the first dummy channel structure has a first width in the second direction and has a second width greater than the first width in the third direction.

19. The semiconductor device of claim 18, wherein each of the channel structures has a first maximum width, and the first maximum width is less than the second width of the first dummy channel structure.

* * * * *